United States Patent [19]

Blyth

[11] Patent Number: 5,164,915
[45] Date of Patent: Nov. 17, 1992

[54] CASCADING ANALOG RECORD/PLAYBACK DEVICES

[75] Inventor: Trevor Blyth, Milpitas, Calif.

[73] Assignee: Information Storage Devices, Inc., San Jose, Calif.

[21] Appl. No.: 644,239

[22] Filed: Jan. 22, 1991

Related U.S. Application Data

[63] Continuation-in-part of Ser. No. 588,949, Sep. 26, 1990.

[51] Int. Cl.⁵ .................. G11C 27/00; G11B 17/00
[52] U.S. Cl. .................................. 365/45; 365/185; 365/189.02; 365/230.02; 360/69; 369/3; 369/34
[58] Field of Search ........... 365/45, 63, 185, 189.02, 365/230.02, 230.03, 73; 369/3, 34, 35, 69, 102; 360/12, 32, 69, 71, 73.07

[56] References Cited

U.S. PATENT DOCUMENTS

| | | | |
|---|---|---|---|
| 2,617,893 | 11/1952 | Sinnett et al. | 369/3 |
| 3,493,681 | 2/1970 | Richards | 369/3 |
| 3,984,822 | 10/1976 | Simko et al. | 365/185 |
| 4,054,864 | 10/1977 | Audaire et al. | 365/45 |
| 4,099,196 | 7/1978 | Simko | 357/23 |
| 4,119,995 | 10/1978 | Simko | 357/23 |
| 4,181,980 | 1/1980 | McCoy | 365/45 |
| 4,314,265 | 2/1982 | Simko | 357/23 |
| 4,318,188 | 3/1982 | Hoffmann | 365/45 |
| 4,368,988 | 1/1983 | Tahara et al. | 365/45 |
| 4,533,846 | 8/1985 | Simko | 307/550 |
| 4,627,027 | 12/1986 | Rai et al. | 365/45 |
| 4,698,776 | 10/1987 | Shibata | 365/45 |
| 4,701,776 | 10/1987 | Perlegos et al. | 357/23.5 |
| 4,717,261 | 1/1988 | Kita et al. | 365/45 |
| 4,890,259 | 12/1989 | Simko | 365/45 |
| 4,963,866 | 10/1990 | Duncan | 365/45 |

OTHER PUBLICATIONS

"A 1 mV MOS Comparator" by Yen S. Yee, Lewis M. Terman, Lawrence G. Heller, IEEE Journal, Solid State Circuits, vol. SC-13, pp. 294-298, Jun. 1978.
1982 ISSCC Digest of Technical Papers re "A 16K E2PROM" by National Semiconductor Corp., p. 108.
"A 25ns 16K CMOS PROM Using a 4-Transistor Cell" (1985 ISSCC Digest of Technical Papers, pp. 162-163).
1989 ISSCC Digest of Technical Papers re "A 5V-Only 256k Bit CMOS Flash EEPROM" by Texas Instruments Inc.

Primary Examiner—Joseph L. Dixon
Assistant Examiner—Jack A. Lane
Attorney, Agent, or Firm—Blakely, Sokoloff, Taylor & Zafman

[57] ABSTRACT

Cascading analog record/playback devices allowing the recording and the playback duration of individual devices to be extended by connecting together multiple devices of the same type. Each such device contains both writing and reading circuits as well as memory circuits. The memory is embedded inside the device and does not have direct access to the outside of the device. All control functions relating to the selection of particular devices is done by the devices themselves without external intervention or assistance. A single input circuit and a single output circuit is used by all devices. In the case of a voice record and playback system, all devices use a single microphone and single loudspeaker.

28 Claims, 17 Drawing Sheets

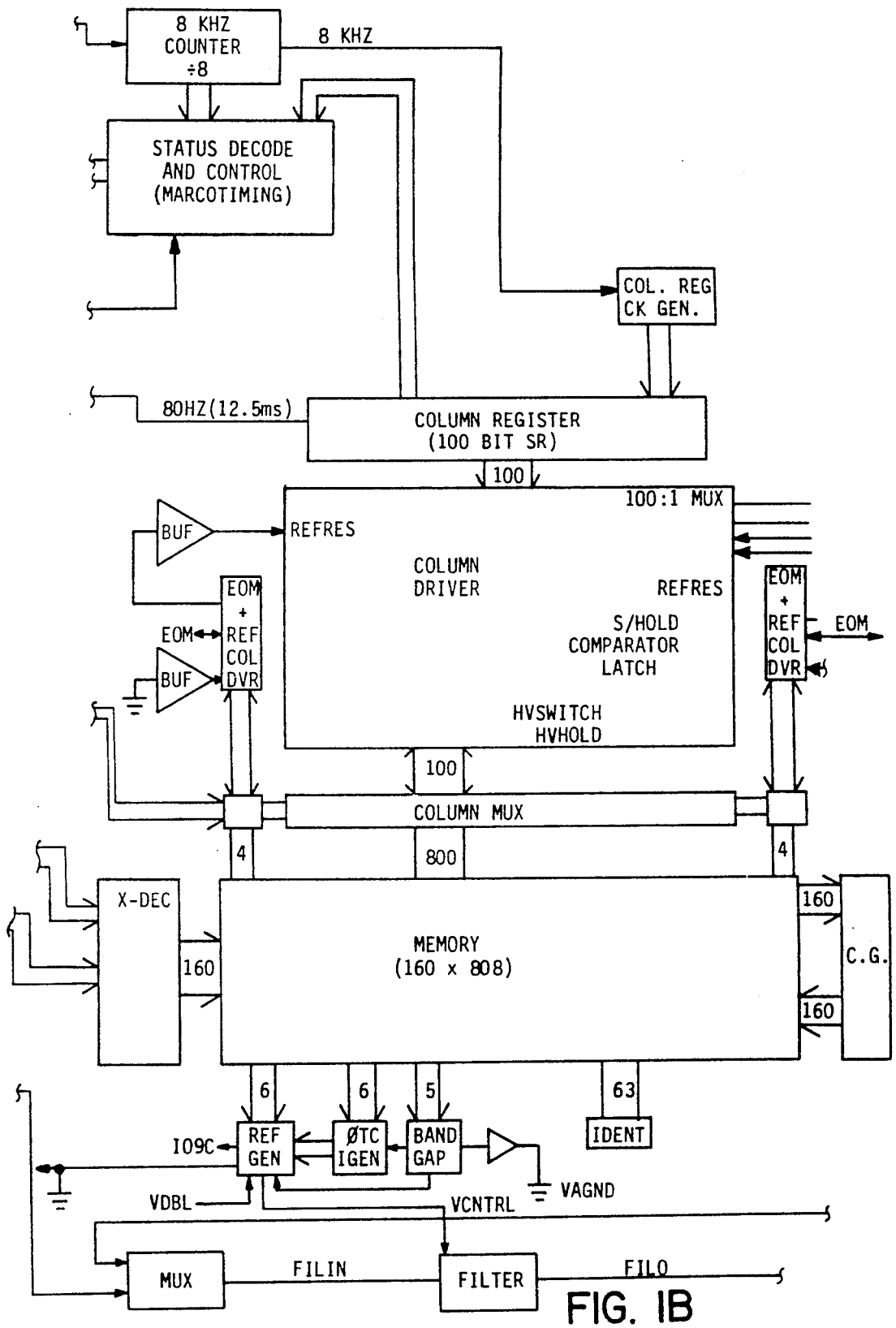
FIG. IB

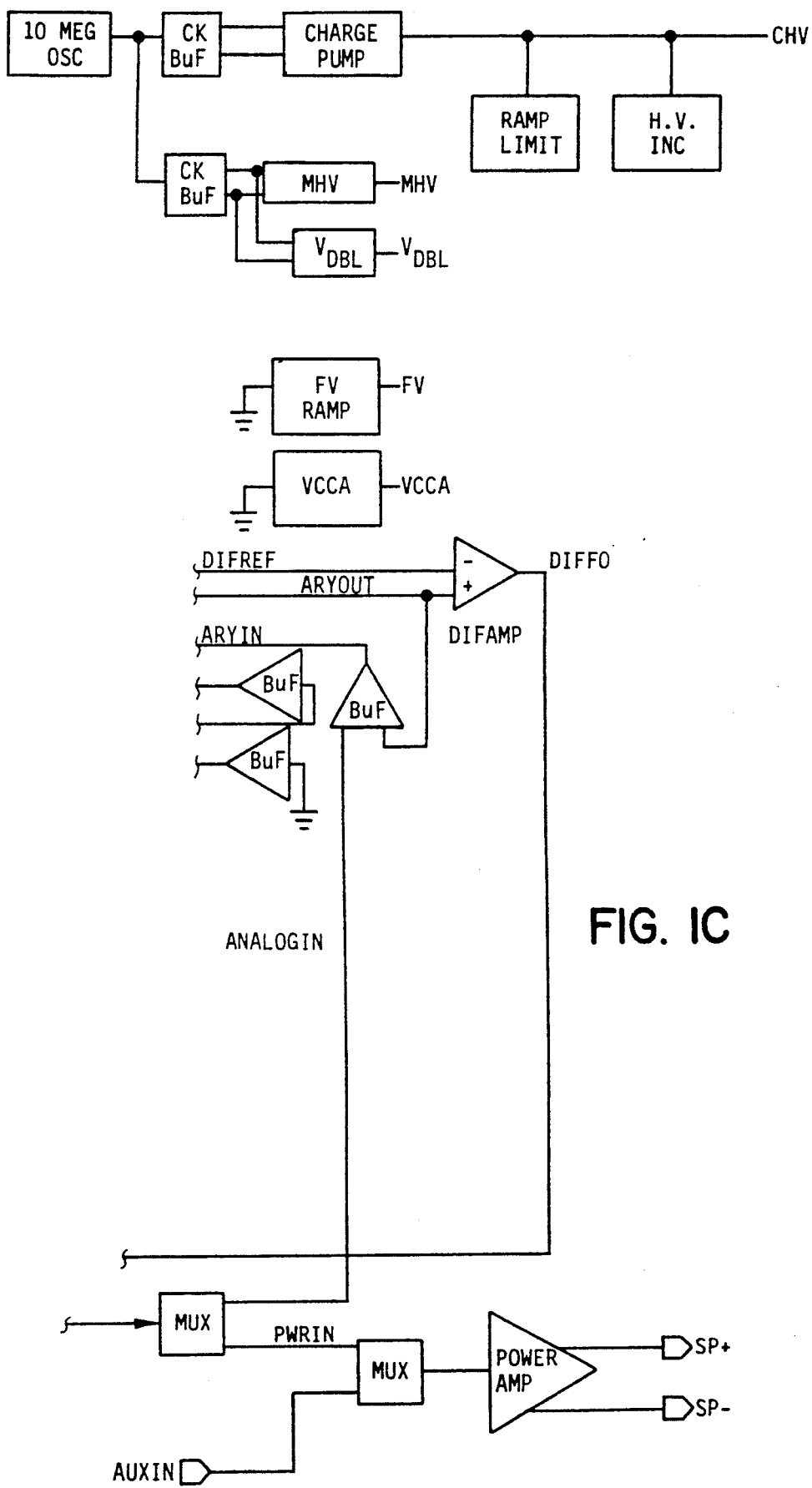
FIG. IC

CASCADING ANALOG RECORD/PLAYBACK DEVICES

This application is a continuation-in-part of an application entitled Integrated Circuit and Method for Analog Signal Recording and Playback filed on Sep. 26, 1990 as U.S. Ser. No. 07/588,949.

BACKGROUND OF THE INVENTION

1. Field of the Invention

The present invention relates to the field of integrated circuits and methods for the recording and playback of analog signals.

2. Related Applications

The present application is a continuation in part of U.S. patent application Ser. No. 588,949, filed Sep. 26, 1990 and entitled Integrated Circuit System and Method for Analog Signal Recording and Playback.

3. Prior Art

A single record/playback device has a record capacity that is, for a certain set of conditions, fixed in duration. In the case of solid state recorders the duration is determined by the number of storage elements or, such as in the case of a digital memory, the number of groups of elements (words). Given a fixed recording density, as determined by the recording technique and the information being recorded, the way to increase storage capacity is to increase the number of storage elements. Existing solid state system designs which have the ability to expand storage capacity in this manner are composed of at least two different types of circuits within a given system. The first type performs the encoding and decoding, or writing into and reading from memory devices of the second type. IN order to expand capacity, additional memory devices are added. In such a system, the first type of circuit is able to direct the writing and reading of stored information to and from any of the memory devices in a controlled manner.

BRIEF SUMMARY OF THE INVENTION

Cascading analog record/playback devices and methods allowing the recording and the playback duration of individual devices to be extended by connecting together multiple devices of the same type. Each such device contains both writing and reading circuits as well as the memory circuits. The memory is embedded inside the device and does not have direct access to the outside of the device. All control functions relating to the selection of particular devices is done by the devices themselves without external intervention or assistance. A single input means and a single output means is used by all devices. In the case of a voice record and playback system, all devices use a single microphone and single loudspeaker.

BRIEF DESCRIPTION OF THE DRAWINGS

FIGS. 1a-c is a block diagram of a preferred embodiment of an integrated circuit analog signal record and playback system in accordance with the present invention.

DETAILED DESCRIPTION OF THE INVENTION

The technique employed in the present invention allows the recording and the playback duration to be extended by connecting together multiple devices of the same type. Each such device contains both writing and reading circuits as well as the memory circuits. The memory is embedded inside the device and does not have direct access to the outside of the device. To provide access would require additional connection nodes or pins on an integrated circuit, which is a disadvantage in any case, but especially so with the analog recording technique described in U.S. Pat. No. 4,890,259 and application Ser. No. 588,949, filed Sep. 26, 1990 and entitled Integrated Circuit System and Method for Analog Signal Recording and Playback where the number of connections would be prohibitive (on the order of 100 or more). The objective, then, is to provide a single device which can function as a complete record-/playback device and which also can be connected with multiple identical devices to extend record and playback duration. All control functions relating to the selection of particular devices is done by the devices themselves without external intervention or assistance. A single input means and a single output means is used by all devices. In the case of a voice record and playback system, all devices use a single microphone and single loudspeaker.

The device described herein is similar to that in application Ser. No. 588,949 referred to above, though the invention is not limited to that implementation. To illustrate an exemplary circuit for use with the present invention, the disclosure of the foregoing application is repeated hereafter as follows.

Figure 1A:
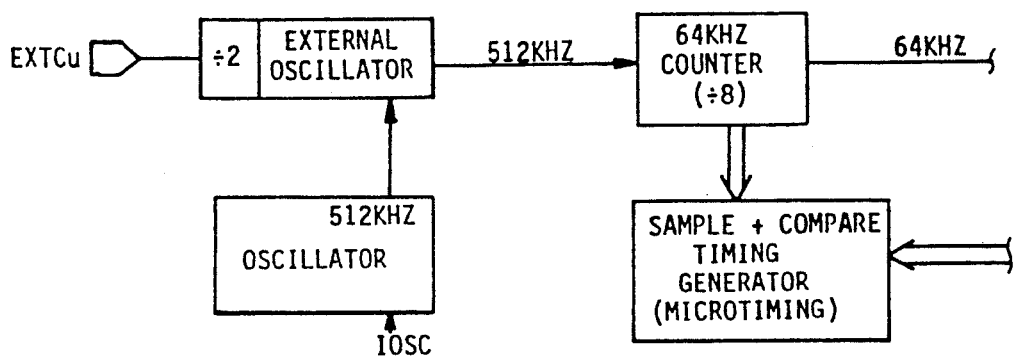
Figure 1A:
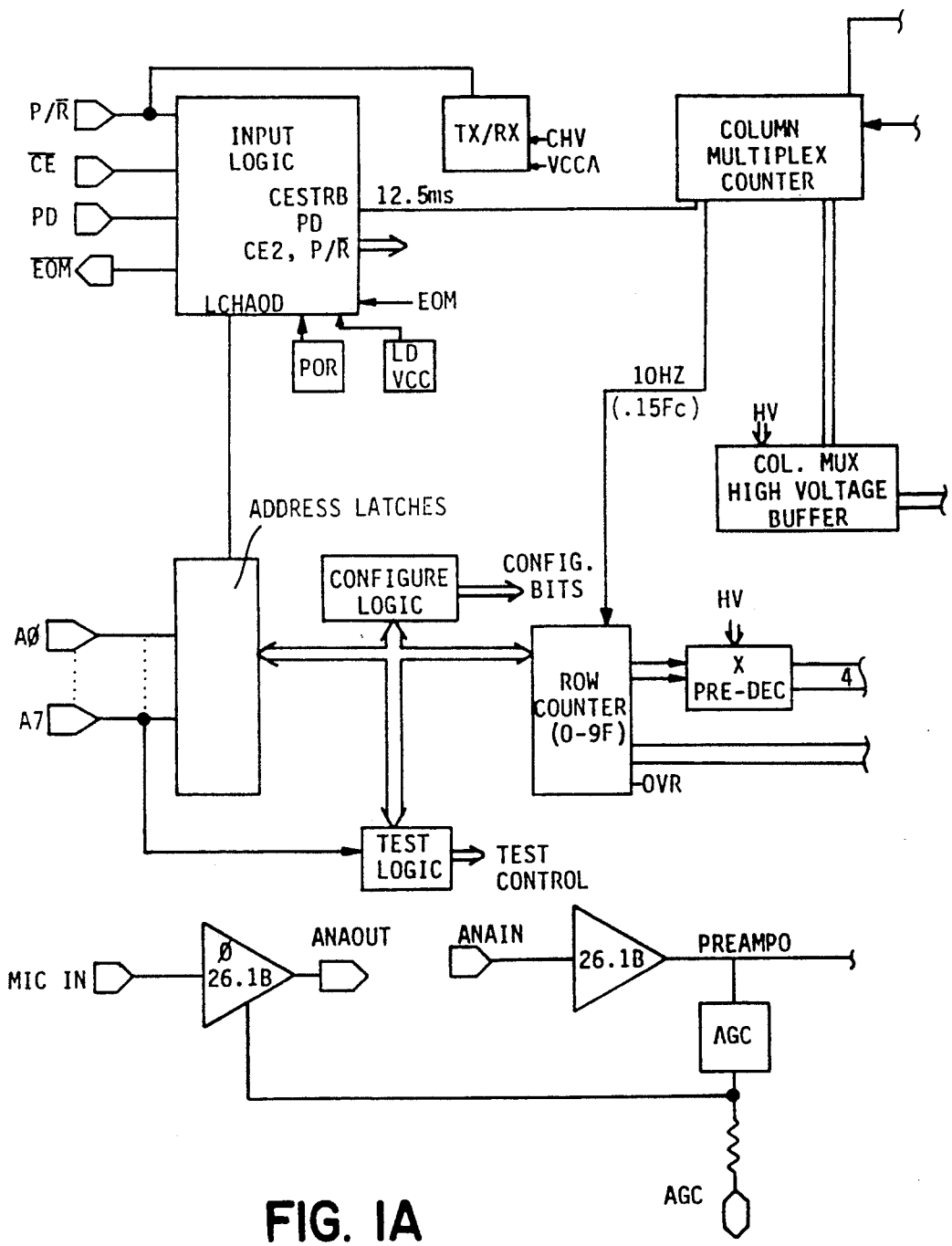

First referring to FIG. 1, a block diagram of the preferred integrated circuit embodiment used as with the present invention may be seen. The circuit shown integrates all major circuits of a solid state sound recording and playback system. The system consists of three major sections—the analog input and output path; the analog storage array; the digital control and EEPROM support circuits. Power is supplied to the analog section and to the array and digital section from separate VCC and VSS supply pins. In that regard, care is taken to minimize noise coupling between the analog and digital sections, not only from the power supplies, but also from the other signals, by way of the block diagram level design, circuit design, physical layout and pin outs, and board level designs utilizing the device.

The analog section provides the audio interface with the microphone and the speaker. There are two distinct signal paths a) Record path b) Playback path. The Analog section can further be subdivided into the following subsections; 1) preamplifier and gain section with automatic gain control (AGC), 2) filter section, 3) power amplifier section, 4) Interface section and 5) reference section.

Record Mode: In the record mode the microphone which is capacitively coupled to the MICIN input pin transduces the audio signal into a low level analog signal. This low level analog signal passes through the pre-amplifier with AGC control and gain stage. The preamplifier and the gain stage are also capacitively coupled through an external capacitor. The output of the preamplifier is the ANAOUT pin and the input of the gain stage is the ANAIN pin. The capacitive coupling avoids saturation of the gain stage by blocking the amplified dc offsets of the preamplifier stage. The ANAOUT signal can be used to output the preamplified signal for other external system requirements. The ANAIN input can be used to record already conditioned signals, directly bypassing the preamplifier. The output of the gain stage goes to the filter in the record path and also feeds back to the peak detector. The peak detector detects the peak level of the amplified signal and holds the level on an external parallel resistor and capacitor combination connected to ground at the AGC pin. This level is then fed back to the preamplifier, thus creating a negative feedback loop. This lop limits the maximum level at the input to the filter section for a large dynamic range audio signal at the microphone input. The external resistor and capacitor combination at the AGC pin allows the attack and release time constants of the AGC network to be varied as per system requirements. There is an internal series resistor at the AGC pin as shown in FIG. 1 which in combination with the external capacitor sets the AGC attack time. The use of the internal resistor reduces the number of external components while still allowing control of the attack and release time constants. All of the above comprises the preamplifier and gain stage with AGC subsection.

The signal going into the filter section is called "preampo". The amplified signal "preampo" then passes through an analog multiplexer to the filter and becomes the signal "filin". The filter then bandlimits the signal "filin" and processes it to produce the signal "filo", which then passes through another analog multiplexer to the interface section. At this point the signal is called "analogin". The purpose of the analog multiplexers is to place the filter in the antialiasing/bandlimiting function during the record mode and in the smoothing function during the playback mode. The use of the filter both for the purpose of antialiasing/bandlimiting and smoothing makes more efficient use of silicon real estate. The filter is a MOSFET-RC fifth order low pass Chebychev type. MOSFET transistors are operated in the linear region with a suitable gate voltage to act like resistors. Low threshold MOSFET devices are used in the implementation of the MOSFET-R to provide a larger signal dynamic range with low distortion in the filter. Also a fully differential scheme is used in the filter for lower signal distortion. Using a differential technique also helps with respect to power supply noise rejection. A closed loop dc control loop maintains the gates of all the MOSFET-Rs at the proper level to generate the effective resistance required for the filter time constants. This gate voltage "vcntrl" comes from the control loop in the reference subsection. This loop locks the filter time constants with the on-chip oscillator time-period, and the two track each other, thereby meeting the Nyquist criterion as applied to sampled data systems. A high voltage supply three times the chip supply is also generated on-chip to supply the dc control loop for "vcntrl", such that "vcntrl" has a much wider control range depending on process, temperature and power supply changes, and so that it does not get limited by the power supply. Also there are test modes implemented in the chip that allows direct access to and from the array, thereby by-passing the filter. This facilitates high speed testing of the array.

Playback Mode: In the playback mode the interface subsection receives two signals, "aryout and "difref" from the column driver subsection. These two signals go into a switched capacitor differencing amplifier to generate a sampled signal equal to the difference of "aryout" and "difref". This difference signal is held in a sample and hold circuit, the output of which is the signal "diffo". The differencing amplifier and sample-hold network is shown as the amplifier DIFAMP in the block diagram of FIG. 1.

The "diffo" signal then passes into the filter subsection. At this time the input and output analog multiplexers are set in a manner such that the filter is switched into the playback path and performs the smoothing function on the rather staircase like difference signal "diffo". The output of the filter subsection then passes into the power amplifier subsection. At this time the signal is called "pwrin".

The "pwrin" signal is coupled to the powder amplifier subsection and first passes through an analog multiplexer. The multiplexer lets either the "pwrin" signal or the signal at the AUXIN input pin pass through to the power amplifier. The power amplifier can thus be used independently for system power amplification requirements. This feature also helps with cascading the multiple chips for extended record and playback duration. The power amplifier itself takes a single ended input and converts it into two separate power output signals of equal amplitude and opposite phase. The two power outputs are called SP+ and SP−. This allows a speaker to be directly connected to the two power outputs without the need for any other external components such as a capacitor, and at the same time allows the speaker to transduce four times more output power for the same signal level. This also provides more power output with limited signal dynamic range and low distortion levels. During the power down mode, the power amplifier outputs are pulled low to provide a low impedance path to ground. This keeps the chip from latching-up due to speaker flyback effects such as occur due to mechanical shocks or vibration. The input to the power amplifier is under the control of the chip-enable signal $\overline{CE}$. Preferably the power amplifier section is a unity gain stage to facilitate cascading of multiple chips.

Figure 2:
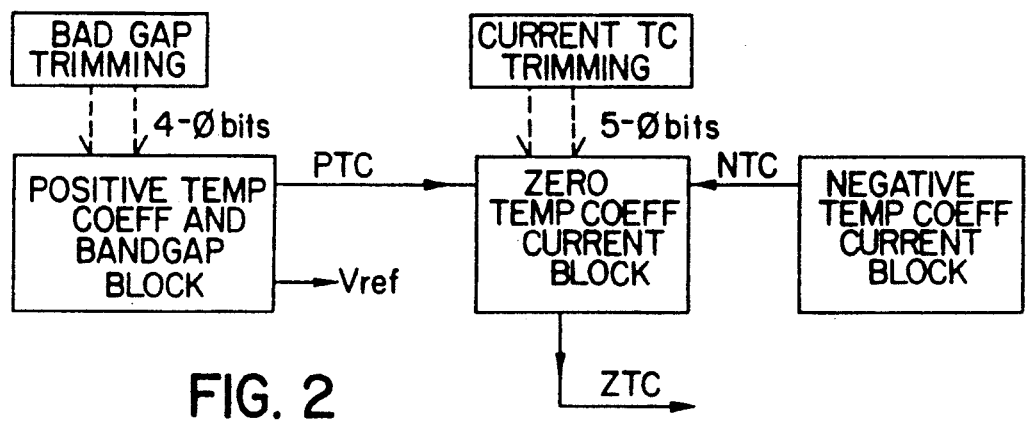
FIG. 2 is a block diagram level representation of a trimming hierarchy in the reference generation block of the circuit which makes use of certain EEPROM cells, allowing the same to be programmed to suitable digital values to set the optimum voltage reference and current reference with the proper temperature coefficients.
Figure 3:
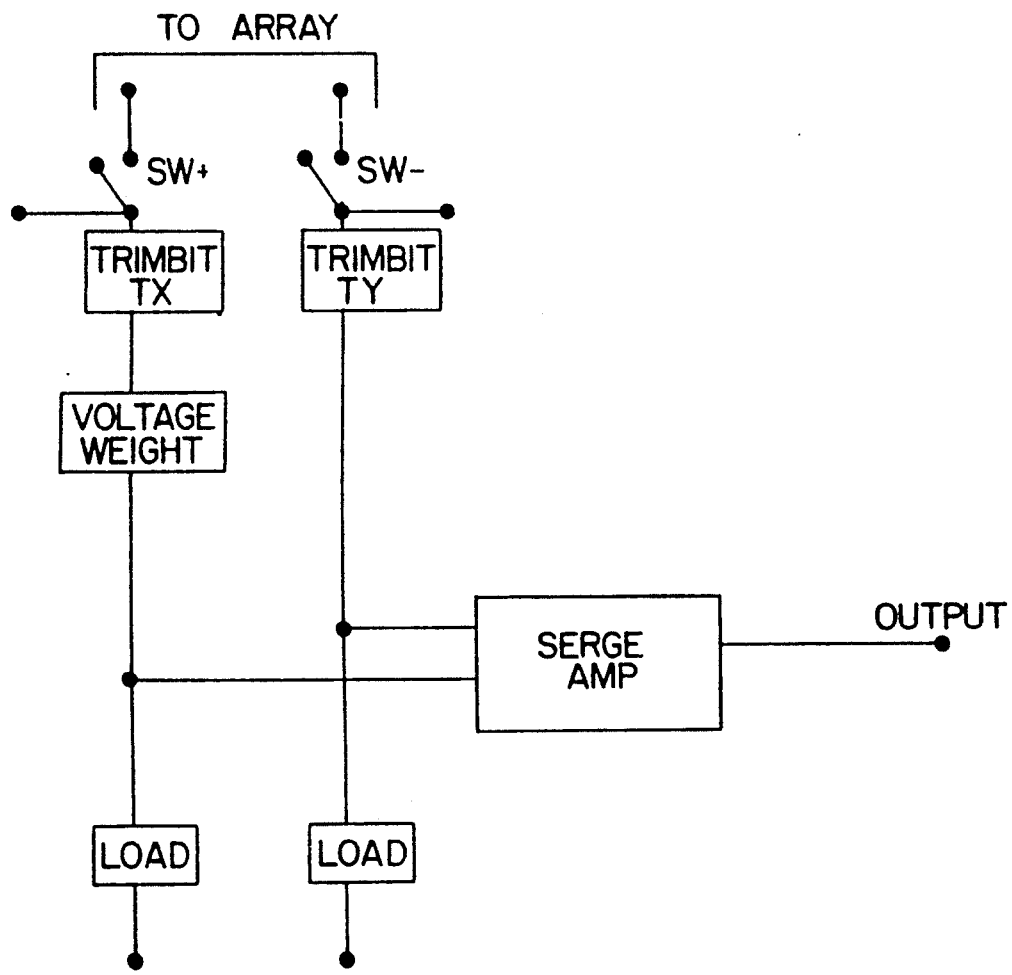
FIG. 3 shows the dual cell differential weighted sensing scheme for the trim cells.

The reference subsection provides all the voltage and current references as required for the chip. Circuits within this section are disposed around the chip to provide for distributed references. This section also contains the dc control loop which locks the filter time-constants and the oscillator time-period and provides the MOSFET-R gate signal "vcntrl" to the filter section. There is a trimming hierarchy in the reference generation block which makes use of certain EEPROM cells, allowing the same to be programmed to suitable digital values to set the optimum voltage reference and current reference with the proper temperature coefficients. FIG. 2 shows the block level representation of this trimming hierarchy. The applicable EEPROM cells are referred to as trim cells, and are part of the core EEPROM array. Two cells with differential logic level programming are used to set a value for one trim bit. A differential amplifier with input weighting is used as the sense amplifier for each pair of trim cells and generates the logic level for each trim bit. The input weighting is used to define the output to a default level when the trim cells are in their native unprogrammed condition. The dual cell differential scheme provides more reliable trim bit logic setting over process changes and life time of the chip. FIG. 3 shows the differential weighted sensing scheme. TX and TY are a pair of trim cells which are required to be programmed with opposite values for the differential technique. A voltage weight is applied to one of the sense inputs. This sets the default value at the output of the sense amplifier. To set the output to a value opposite to the default value, an overriding opposite type of differential value has to be programmed across the sense amplifier inputs through the trim cells. SW+ and SW— essentially connect the trim cells to the array and then to the column drivers during programming and disconnect the trim cells from the array during sensing. FIG. 2 has a positive temperature coefficient current and bandgap voltage generator. There are five trim bits for setting the optimum voltage "vref" such that the temperature coefficient of "vref" is small. By changing the bandgap trim bits it is also possible to have either a positive temperature coefficient or a negative temperature coefficient for "vref". From the bandgap block, positive temperature coefficient current "PTC" is also derived and used in the zero temperature coefficient current block. This block also gets a negative coefficient current "NTC" from the negative coefficient current block. The current TC trimming bits control the relative proportions of the positive and negative temperature current addition in the zero temperature coefficient current block. The output current "ZTC" in fact can either be a positive TC or a negative TC or a zero TC current depending on the setting of the current TC trimming bits. All these bits are set during testing and give the capability to trim the chip for meeting specification and enhanced performance over wide variations of an uncharacterized process. The "ZTC" current is then used in the oscillator and the dc control loop for MOSFET-R gate signal "vcntrl". There is also a regulator on-chip, part of the reference subsection that provides the biasing to the array during playback. This regulated supply "Vcca" helps with supply noise rejection during reading of the array cells.

Figure 4:
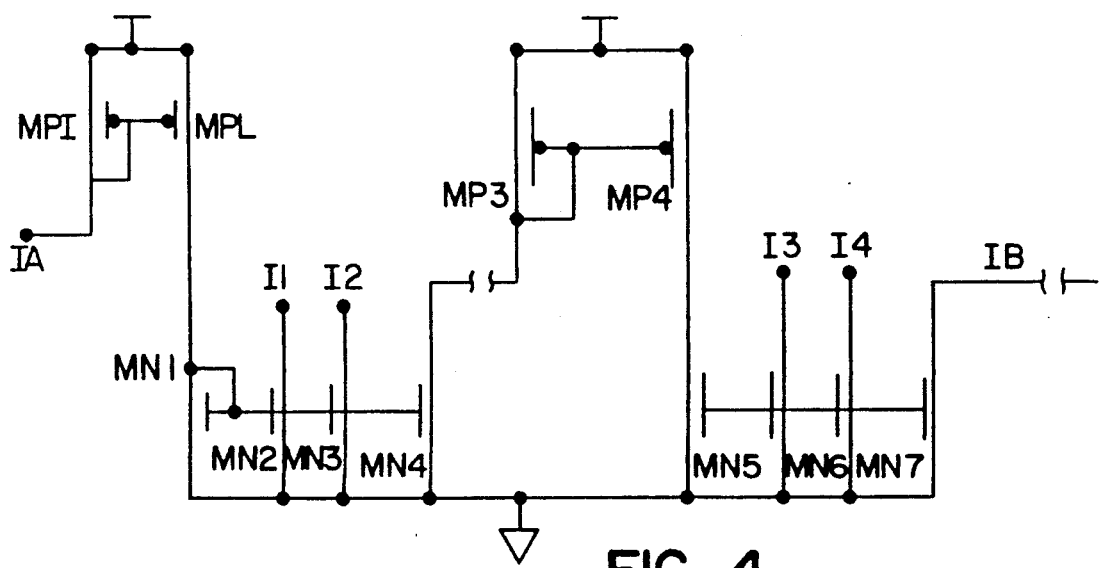
FIG. 4 is a circuit diagram illustrating the current bias distribution scheme.

DC operating point bias, as required by all analog subsections, is distributed around the chip through a current bias distribution scheme shown in FIG. 4. Current is in fact carried from one place on the chip to another. This does not create problems of inaccurate biasing as is possible with voltage biasing wherein problems are normally caused by IR drops across power lines and mirror transistor threshold mismatches across the chip. Circuitry incorporated on the chip manages the power dissipation of the chip depending on the mode of operation such that subsections not operational during certain modes are powered down. For instance, the preamp and gain stage sections during the playback mode, and the power amplifier section during the record mode, are respectively powered down. This helps to bring down the average power dissipation of the chip. Note that since the chip operates from a single 5 V supply, an internal analog ground is also generated, which provides for the ground reference for all analog signals. This analog ground reference is suitably chosen to provide for the optimum signal dynamic range throughout the system with minimum distortion. The analog ground reference is called "Vagnd". In the particular embodiment disclosed, it is at +1.5 V with respect to Vss.

Referring to FIG. 1 again, ANALOG IN is the signal used as the analog input to the memory array. ANALOG IN is sampled at a frequency of 8 Khz onto the dual sample and hold arrays. As described in the Simko patent (U.S. Pat. No. 4,890,259), storage is done in a sequential manner onto two bands of sample and hold capacitors. As one bank is being loaded serially (at the sample frequency), so the other bank is used to output its contents in a parallel fashion to the write circuits. In this manner the analog signal is sampled continuously without interruption while the page mode type writing process is taking place simultaneously.

Figure 5:
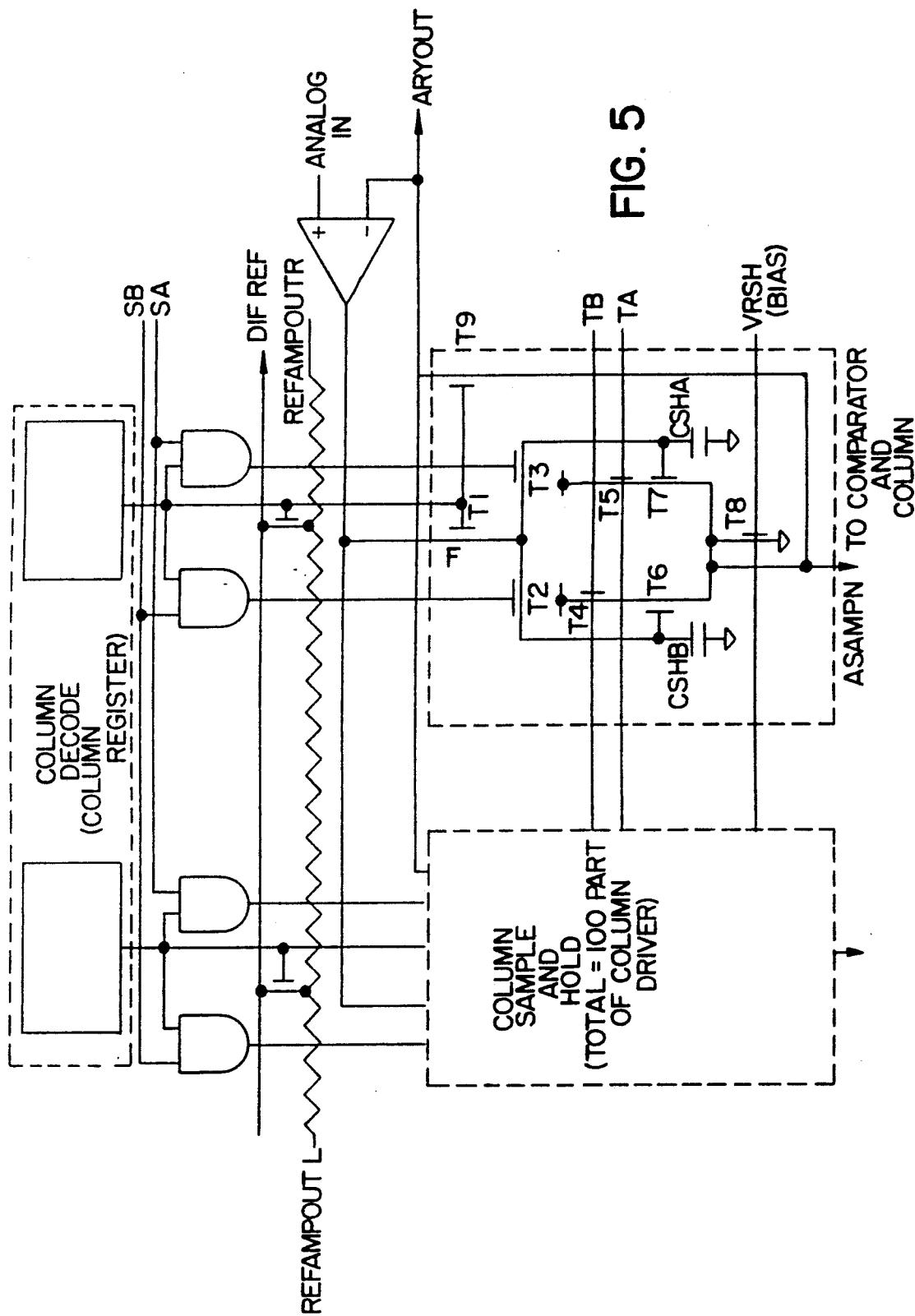
FIG. 5 is a circuit diagram for the closed loop sample and hold circuits and associated circuitry which compensates for the threshold losses and other non-linearities and manufacturing variations which may exist across the die.

Now referring to FIG. 5, loading of the sample and hold circuits is done with a circuit which compensates for the threshold losses (and other non-linearities and manufacturing variations) which may exist across the die. ANALOG IN is applied via an amplifier, through the transfer gates (T1 and T2 or T1 and T3) which are enabled by the column decode and transferred onto the sample and hold capacitor (CSHA or CSHB). T8 is a current load device which forms a load for the voltage follower transistors T6 and T7. There are two possible paths from the output of the amplifier, namely through T1, T3, CSHA, T7 and T9, or through T1, T2, CSHB, T6 and T9. When side A is in use, then T2 and T4 remain off; when side B is in use, then T3 and T5 remain off. The column decode ensures that only one sample and hold circuit is selected at any one time. Since the transistors T1, T2/T3, T6/T7, T9 are in the feedback path, any voltage loss or gain through the transistors is compensated by the amplifier action which adjusts the amplifier output until the level at the inverting input is equal to ANALOG IN. The voltage range over which the loop action occurs must be equal to or greater than the signal dynamic range which is to be stored. The circuit shown here uses only N-type transistors for T1-T9. This implies that the signal dynamic range is less than VCC by an accumulation of threshold drops through T1-T9. Use of N-type and P-type transistors as a no-loss transfer device to replace T1, T2, T3 and T9 would increase dynamic range; as would use of low threshold values (e.g. a native device for T6 and T7). The column decoder (or column register) selects each sample and hold circuit in turn at a frequency equal to the sample rate. The signals SA, SB, TA and TB are manipulated so that each bank of sample and hold capacitors are loaded in turn. When all the capacitors in one bank have been loaded (say bankA) i.e. when the column decoder reaches its upper limit, then the column decoder returns to its lower limit and the other bank of capacitors (say bankB) are then loaded. SA and SB act as strobe signals and have a time duration less than the period of the sampling frequency. In each (125 $\mu$sec) sample period, either TA (and SA) or TB (and SB) are brought high to turn on the appropriate source follower and connect it into the control loop. After sufficient time has been given for the loop to settle, SA (or SB) is taken low and the capacitor now holds its stored value. TA and TB are now toggled so that the stored value on the other capacitor is brought through the source follower and onto the node ASAMPN which goes to the comparator. At this time, all the stored values are output in parallel from the sample and hold circuits into the comparators.

In the preferred embodiment there are 100 similar pairs of sample and hold capacitors and source followers. Consequently each (100×125 $\mu$secs) 12.5 msecs a new set of values appear on the 100 ASAMPN parallel outputs. The writing circuits are therefore allowed 12.5 msecs in which to write the values into the memory array before the next set of values appears.

Figure 6:
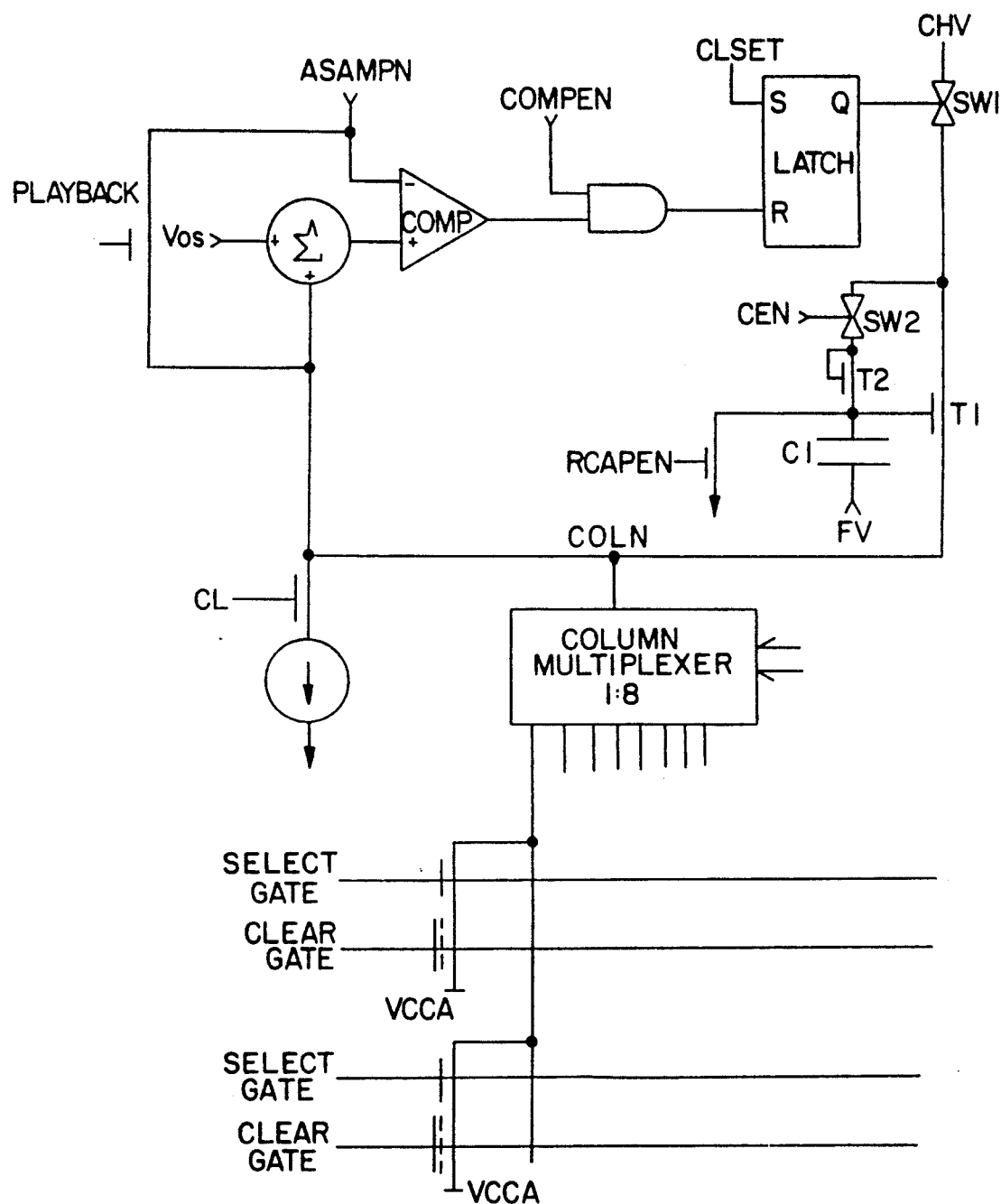
FIG. 6 is a schematic diagram for the circuit used for the dual level iterative write of the present invention.

Referring to FIG. 6, the writing process takes place by successively applying high voltage pulses to the column, configuring the memory into the read mode, reading the stored value from the cell, comparing the result with the required value on ASAMPN, and then repeating the process if the value is less than ASAMPN using pulses of increasing amplitude. In order to obtain improved resolution, the writing process is done in two stages; these are referred to as the coarse cycle and the fine cycle. (A simplified scheme would also work—i.e. elimination of SW2, the Vos adder and the FV storage capacitor and using only the coarse cycle. However the coarse/fine cycle allows better resolution.) All the cells in the row are first cleared by applying a high voltage to the clear gate of that row while keeping the drain (i.e. the column node) at VSS. (The preferred embodiment clears only the addressed row, and if the recording carries over into subsequent rows, then a clear pulse must be applied at the beginning of every row. However, if the application allows, then the complete array could be cleared by connecting all the clear gates together and applying a single high pulse to all rows at the beginning of the write cycle). A pulse is applied to CLSET to set the latch and enable (open) SW1 and a single pulse is applied to RCAPEN to discharge the capacitor C1 to VSS. CEN is held high for the complete coarse cycle and low for the fine cycle i.e. SW2 conducts only during the coarse cycle. The first high voltage pulse is applied to CHV and consequently to the addressed column. Only on Select Gate is high so the high voltage is applied to the drain of the addressed cell. The array is then configured into the read mode and the addressed cell contents are read through the column multiplexer to COLN. In readback mode the VCCA node is taken to a positive voltage, CL is taken high and a current load to a negative level (in this case VSS) is applied to the cell. (CL is held low during the high voltage pulses.) After an increment Vos has been applied to COLN, the result is compared with ASAMPN. At the appropriate time (allowing for settling of the comparator COMP and also the interleaving of the high voltage pulses), COMPEN is pulsed to enable the reset path into the latch. If (COLN+Vos) is less than ASAMPN then the latch remains set and subsequent high voltage pulses are applied to the column, but if (COLN+Vos) is greater than ASAMPN then the latch is reset, SW1 is opened and further high voltage pulses are blocked. Sufficient high voltage pulses (of a monotonically increasing level) are applied to ensure that the cell could be programmed to a level corresponding to the maximum level. Once the latch is reset, and SW1 remains open, the voltage on C1 remains stored for the remainder of the coarse cycle due to the action of T2 which acts as a reverse diode at this time. Hence the level stored on C1 is the level which produced the last high voltage pulse to the columns. At the end of the coarse cycle, the latch is set once again by a pulse on CLSET and another series of high voltage pulses appears on CHV. Whereas in the coarse cycle the pulses were of continually increasing magnitude; in the fine cycle they are all of maximum amplitude. The level which is actually applied to the column, however, is determined by the voltage stored on C1. This stored value is modified by the signal FV applied to the bottom plate of the capacitor. During the coarse cycle FV is at a fixed voltage (2 V). At the beginning of the fine cycle FV is taken to 0 V and then ramped up continuously during the fine cycle to a positive voltage (2 V in the preferred embodiment). Thus, the first high voltage of the fine cycle is 2 V lower than the high voltage pulse which caused the comparison during the coarse cycle. Each successive high voltage pulse of the fine cycle is slightly higher than the previous pulse by a value which is determined by the ramp rate of FV. It is not necessary for FV to be a smooth linear ramp—a continually increasing level, such as a staircase incremented by small amounts at each successive high voltage pulse would also serve the purpose. After each high voltage pulse, the cell is returned to the read configuration and COLN is compared to ASAMPN. During the fine cycle, however, there is no addition of Vos (or Vos is kept at 0 V). The charge increment which is added to the cell is relatively small during the fine cycle and consequently there is improved resolution and writing accuracy. At some time during the fine cycle, COLN will exceed ADAMPN, the latch will be reset and the remaining high voltage pulses will be blocked by the opening of SW1.

The end of the fine cycle is coincident with the column register reaching its maximum value i.e. a new set of samples has been laid into the sample and hold capacitors. The manipulation of the TA, TB, SA and SB signals is now reversed and a new set of parallel ASAMPN values is presented to the comparators. The inputs to the column multiplexer are also changed so that a new set of columns are connected to the column drivers. The time period where the column register passes from minimum through its maximum and returns to its minimum will be referred to as a scan. The procedure is then repeated for the next scan or set of 100 cells.

After a total of eight scans (i.e. a total of 800 cells) have been written, the row address is incremented and a new row is selected. In this case a clear pulse must be applied before beginning the write procedure.

The particular details for the preferred implementation are:

45 coarse pulses beginning at 9 V (at the column) and increasing linearly up to 18 V. The high voltage coarse pulse ramp rate is 420 mV/microsecond, with a pulse width of 109 microseconds repeating every 125 microseconds.

90 fine pulses of 18 V maximum (at the column; due to the voltage drops in the switches and T1 this corresponds to about 21 V at CHV). Ramp rate is 840 mV/microsecond, pulse width 47 microseconds and a repeat period of 62.5 microseconds.

FV ramp is 0 to 2 Volts in 5.625 milliseconds. Vos (effective after division due to circuit implementation) is 0.2 V.

Programming does not necessarily take place at the extreme ends of the coarse and fine cycles. At the beginning of the coarse cycle the high voltage level is too low to produce a read voltage greater than 0 V (tunneling may be taking place but the floating gate may be highly erased and has a high enhancement threshold). At the end of the coarse cycle all latches have been reset—even for the columns which have ASAMPN levels at the maximum (3 V for the preferred embodiment). At the beginning of the fine cycle the reduction in high voltage due to the 2 V decrement on C1 reduces tunneling currents to very small levels. Similarly at the upper end of the fine cycle all latches have been reset. This margin at each end of the coarse and fine cycles is quite wasteful since, if the minimum and maximum high voltage pulse levels could be brought closer together in both coarse and fine cycles, then the voltage increments could be reduced, thus producing an improvement in resolution. However, it is necessary to include these margins to ensure the full dynamic signal range without clipping that might otherwise occur with changes in cell programming behavior due to variations in tunnel thresholds, cell capacitor ratios and other process variations that take place in a real manufacturing environment. A possible embellishment would be to adjust these margins and the associated ramp rates, Vos etc. by the use of trimming. Thus, conditions would be optimized for individual characteristics and improved resolution could be achieved.

The comparator used in the column driver is of the type described by Yen S. Yee, et. al., IEEE J. Solid State Circuits, pp. 294–298, June 1978. This comparator has the advantage of being small (in terms of silicon utilization) but also it has a very small offset due to the auto-cancellation mode of operation. This has special significance for the preferred embodiment because any random offset of each comparator across the row of column drivers would manifest itself in this offset pattern being superimposed on the recorded signal. Such offset is not a variable that is compensated for in the closed loop writing scheme and would consequently be present on the playback signal. The systematic offsets e.g. the clock feedthrough into the coupling capacitors, is not a concern because this is equal for all comparators (to a first approximation) which results in a d.c. shift of the recorded level. Even this is not a concern because there is an equal shift in the reference voltage which is subtracted during playback.

The description so far is based on a source follower configuration for the memory cell. It would also be possible to realize a working system with the more usual inverter-type configuration but loss of linearity and resolution would occur. The signal from the array would effectively be inverted so the write loop would need to accommodate this, i.e. high voltage pulses would continue to be applied to the column until COLN was less than ASAMPN. For instance the inputs to the comparator could be switched.

Any time that the array is placed into the read configuration, the selected clear gate is taken to a fixed voltage. The value of this voltage determines the amount of charge that is coupled from the clear gate onto the floating gate and can therefore be used to adjust the range of read voltages for a given set of clear and program conditions and cell characteristics. A voltage is also applied to VCCA, the positive supply for the source follower. In the preferred embodiment, the clear gate voltage and VCCA during read are both connected to a 4 V regulated supply. This is derived from the VCC power supply, but due to the regulation (the reference for which is the bandgap voltage), the voltage is stable and has relatively low levels of superimposed noise. In the case of the clear gate this is important due to the direct coupling onto the floating gate. VCCA is also important due to coupling from the VCCA diffusion to the floating gate—in some EEPROM transistors this capacitance can be high due to the increased gate to source/drain area caused by implants which are not self-aligned to the gate structure. Reduced noise coupling onto the floating gate during read improves the noise level during record and playback.

During playback, the array is configured into the read mode, CL is taken high and the nodes COLN and ASAMPN are gated onto ARYOUT via T9 of FIG. 5. The addressing during playback is also sequential, so the signal on ARYOUT is the recomposed sampled analog waveform. Note that ciphering or encoding can be done by using different addressing schemes between playback and record. Provided that the differences are known by a user, the original form can be reconstituted by the user and not by an interloper having access to the encoded playback information.

In addition to the 100 signal column drivers, there are two additional column drivers, one at each end of the array, for writing the reference columns and the EOM (End of Message) columns (See FIG. 1 and also FIG. 5). The reference column driver is basically the same circuit as the other column drivers. Instead of ANALOGIN, however, the input signal is a fixed reference voltage, VAGND, which is written into two additional columns at each end of the array. During playback the recorded reference voltage is input, together with ARYOUT, into a differencing amplifier. The purpose of this is to compensate for effects which would otherwise be detrimental to playback quality—the different hold times on sample and hold circuits across the row of column drivers (and consequently the different leakage amounts); and the changes in read voltages due to threshold temperature shifts, changes in the clear gate voltage and other changes in the environment. During playback a signal DIFREF is created by the reference system and is subtracted from ARYOUT by the differencing amplifier described previously.

Two columns at each end of the array are used to allow for any difference in behavior of the two banks of sample and hold capacitors that may exist due to circuit design, timing or physical layout. The total of four reference columns are written during the writing of the first scans—two columns during each scan. During the writing of the remaining six scans in the row, the output of the reference column driver is not connected to a column. The reference column drivers receive their decode input from the column register bits belonging to the adjacent column driver. Thus the length of time that the sample and hold capacitor must hold its voltage is equal to the hold time of the adjacent column drivers and will consequently suffer an equal amount of charge loss due to leakage. (This may not be precisely true due to local irregularities in the physical structures; however, it is approximately the case and at least will exhibit the same tendencies.) During playback the recorded reference voltage from each end of the array is read from the reference columns, is buffered by an analog buffer, and connected into each end of a linear resistor (see FIG. 5) which extends along the row of column drivers. The selected column driver then connects the resistor tap at its own location along the resistor into the node DIFREF. Thus the node DIFREF is at a voltage which is between the stored reference voltages and of a value which is proportional to the length of storage time of the addressed column. (The dimensional length of the resistor in the physical layout is the same in each of the column drivers and so the resistance value from one end to the other increases linearly along the length of the row of column driver.) The voltage on DIFREF is therefore representative of the voltage loss due to charge leakage at the sample and hold capacitor of the addressed column driver. This function of the reference columns and associated reference resistor is especially important at high temperatures when charge leakage is increased. An additional function of the reference system is to compensate for changes in transistor threshold voltage with temperature. The voltage read from each cell varies with temperature and would be observed as a change on the level of ASAMPN during playback. Since all the cells are at the same temperature (as a first approximation) there would be resultant DC shift in voltage. This is not particularly important for speech recording, but if the DC voltage is desired to be maintained unchanged (as is the case for some applications) then the reference system will compensate for this by subtraction at the differencing amplifier.

As well as the two reference columns, there are an additional two columns at each end of the array. These columns store digital values and are used to indicate an end of message (EOM). Since the data is in less sensitive digital form, the columns are positioned at the outside of the array. This also ensures that the reference columns have memory cells on all sides (just as the rest of the analog array). The surroundings of each cell is therefore identical, allowing for consistent manufacturing and similar electrical conditions. This is important for the reference columns, but not so critical for the EOM columns. The EOM functions in the following manner. A recording may be terminated by a request from the control pins ($\overline{CE}$ or PD). The input logic transmits this request to the EOM column driver and high voltage programming pulses are passed to the EOM columns. Either the EOM cells remain fully erased or they receive all the available high voltage pulses in the event of an EOM request being received from the input logic. Message length increments of 25 msecs is considered adequate, so an end of message is allowed at the end of every second scan. This means that there are four possible EOM positions on every row. With four EOM columns available a simple one of four assignment is implemented. It would also be possible to encode the position for the end of message. If the position resolution of the end of message is 12.5 msecs (a scan), then three columns and eight possible programming combinations could be utilized. Alternatively, eight columns could be used, resulting in no decoding being required to determine the EOM position. During recording then, the EOM column driver passes high voltage pulses whenever a EOM request is received from the input logic. This is directed to only one of the four possible EOM columns depending on the path selected by the column multiplexer. The recording is then terminated by disabling the write circuits. The result is to have erased EOM cells for the complete duration of the recorded message, except for the cell which is addressed at the end of the message—this cell is programmed. During playback, the EOM columns are continually monitored—they are connected into the same read configuration as the rest of the array. When a programmed cell is addressed, a high level is detected and this signal is transmitted to the input logic. The playback may be automatically terminated, depending on the state of the control circuits. The $\overline{EOM}$ pin is taken low to indicate that an EOM condition was detected. This eliminates the need for the end of message address (location) to be known by the external control. The external controller simply instructs the preferred embodiment to begin playback from a start address and the chip will stop automatically at the end of message and/or signal this condition by pulsing the $\overline{EOM}$ output.

An extra row of cells is included at the opposite end of the array to the column drivers. This row, referred to as the trim row, is connected into the array i.e. to the columns and to a special row driver, through a set of transistors that are turned on only during a particular test mode. In this test mode, the trim row is selected and can be written to and read from through the column drivers. When the device is not in this test mode, the trim row is configured into the read mode. Some of the cells in the trim row are connected in pairs to the inputs of a weighted differential amplifier, as described previously, to provide the trim bits. Other bits in the row are available for storing information—in either analog or digital form—for access only during test mode. The advantage to using the extra row is that the existing writing circuits (column drivers and X pre-decode) can be utilized. The trim bits are required continuously by the trimming networks in the form of a parallel output. This arrangement provides this without the need for large amounts of additional hardware.

Figure 7:
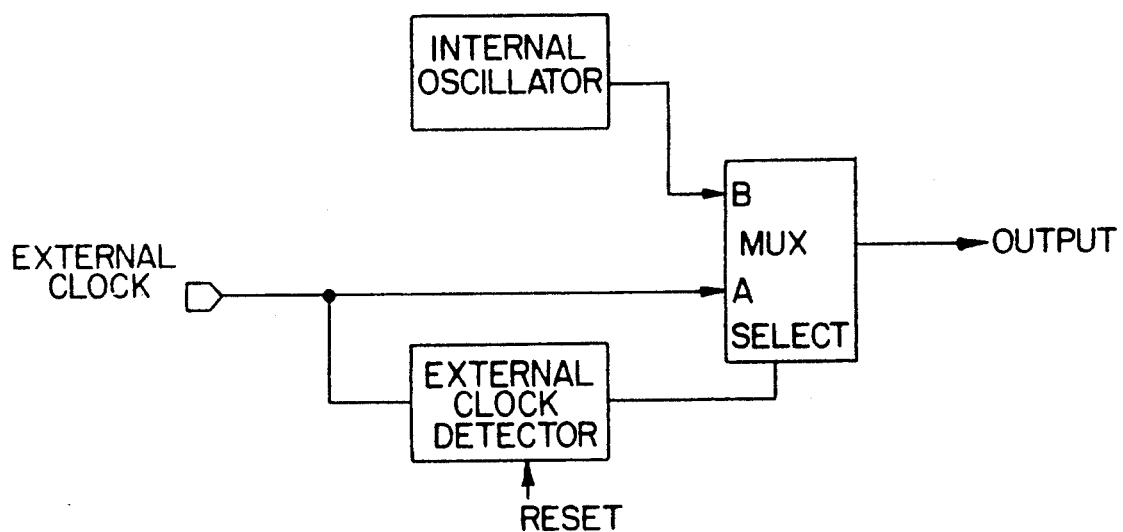
FIG. 7 is a block diagram of the clock circuit of the present invention.
Figure 8:
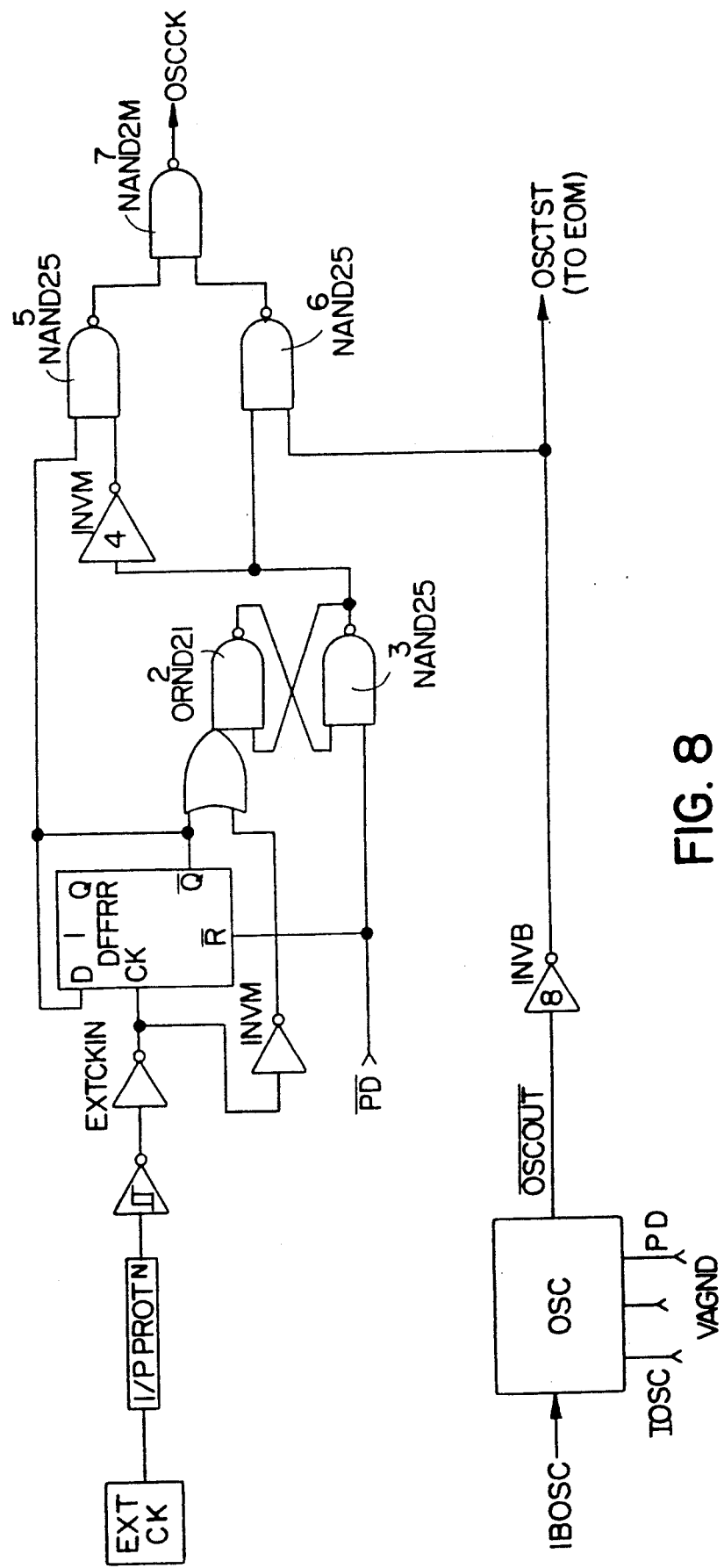
FIG. 8 is a circuit diagram of the clock circuit of FIG. 7.

The timing for the chip is derived from a single timebase (See FIG. 7 for a block diagram and FIG. 8 for the preferred circuit). An on-chip oscillator which has no external components is used to derive all the required clocks and timing signals. The nominal output frequency is 512 Khz. An input pin is provided should it be necessary to synchronize the chip to external clocks or timebases. In this event the external oscillator block detects the presence of an incoming frequency and steers the external clock to the 512 Khz output. If external synchronization is not required, the external clock pin is connected to either power supply pin, and the external oscillator block gates the internal oscillator to the 512 Khz output.

The internal oscillator is of the relaxation type and operates on the principle of charging a capacitor to a certain voltage by applying a certain current. Both the current and the voltage levels are obtained from the reference section—the voltage is fixed (VAGND) and the current is variable, however it would also be acceptable for this to be reversed. In fact two capacitors are used to allow for the discharge of one capacitor while the other is being charged, thus providing a more accurate discharge voltage and reduced signal propagation delays in the sections of the circuit which perform switching. The output from the oscillator is used by the 64 Khz counter and subsequently the timing circuits and sample clock. However, it is also routed through additional test logic to an output pad ($\overline{\text{EOM}}$). If the correct test mode is selected the oscillator output is directed to the EOM pad, thus allowing the oscillator frequency to be measured. The variable parameter ( in this case current) is adjusted by modifying the appropriate trim bits until the oscillator frequency is at the desired value. This of course adjusts the sample frequency by the same proportions and, as described previously, since the variable current is derived from the same source as that which sets the filter roll-off frequency, the filter characteristics track the oscillator and change by the same proportion. The ability to trim the oscillator frequency allows an accurate setting of sample frequency and consequently the maximum recording capacity of the array. Another advantage is that it allows sample frequency to be adjusted to suit the application. Reproduction quality can be improved by increasing sample frequency (at the cost of reduced record duration). However, if the application requires longer duration then this can be achieved at the cost of quality—trimming allows either from the same part. It is also critical that the oscillator be stable over various operating conditions such as temperature and power supply levels. If there is any variation in sample frequency between playback and record then the reproduction quality is effected—±2% is considered to be the maximum acceptable variation for voice recordings. Use of the stable current and voltage outputs from the reference section provides this stability.

As shown in FIG. 1, the output from the external oscillator is directed into the 64 Khz counter. The 64 Khz counter in turn produces the clock input for the 8 Khz counter. The 8 Khz output is then buffered by the Column Register Clock Generator (COL. REG. CK GEN. in the block diagram of FIG. 1) to create the column register clock pulses. Whenever the chip is powered down or deselected, the clock generator applies a reset to all stages of the (100 bit) column register. At the beginning of every record or playback operation the clock generator loads a logic "1" into the first stage of the register. With each subsequent 8 Khz clock the logic "1" is shifted along the register—all other stages are at logic "0". The output of the last stage produces the 80 Hz clock for the column multiplex counter and is also returned to the first register stage so that the logic "1" cycles through the column register repeatedly. The single logic "1" from the column register is used to successively select the column driver and perform the sampling into the sample and hold capacitors during record and out from the column drivers during playback. (The column register function could also be performed by a (modulo-100) counter and decoder). The column multiplex counter is a modulo-8 counter and provides the inputs to the 8:1 column multiplexers. The carry output produces the 10 Hz clock for the row counter and is also used in the status decode and control block.

The status decode and control block receives inputs from the column register, column multiplex counter and the 8 Khz counter. Its purpose is to provide the higher level timing control (or macrotiming), particularly for the write operation. The complete write cycle is accomplished in the time required to write one complete row—clearing is performed one entire row at any one time. Eight times during each row, or once during each scan (i.e. each passage through the column register) the write circuits must execute the coarse and the fine cycle. In terms of timing, then, each row and also each scan must be subdivided into different time slots, during which there are unique control sequences to be performed. The states of the address circuits are used to define these time slots and consequently also used to derive the control signals associated with clear, coarse and fine cycles.

Further subdivision is done by the 8 Khz counter. For instance, during each sample of 125 microseconds there are periods of high voltage activity interleaved between the sample and compare operations of the column driver. These different activities take place in each sample period under the control of signals created by outputs from the 8 Khz counter. All high voltage activity is halted and also additional settling time is given to minimize the amount of electrical disturbances that would otherwise occur if the high speed switching of relatively large capacitances was allowed to take place simultaneously with the more sensitive analog operations. The separate high voltage and compare events are not necessarily limited to a single sample period; nor is each event necessarily completed in a single sample period. For instance, the clear pulse takes place over ten sample periods without any comparisons, a coarse pulse and one comparison take place in one sample period and there are two fine pulses and two comparisons in a sample period. The fine resolution of the control signals (microtiming) within each of the previously defined modes is done by the outputs of the 64 Khz counter. Signals such as SA, SB, TA, TB and others which are required to be switched at short time intervals are controlled by the 64 Khz counter.

The output of the column multiplex counter not only goes to the status decode and control logic, but also to the input logic (where it is used as a switch debounce clock), to the row counter and to the column multiplex high voltage buffer. In order to multiplex the column driver onto the columns it is necessary to use high voltage signals to drive the switching transistors. To minimize the number of level shifters, the outputs from the multiplex counter are level shifted and the high voltage outputs used to drive a multiplexer which selects the connection path through several transistors connected in series.

The row counter is clocked by the 10 Hz output from the column multiplex counter. It is a binary counter which may also be preset to a value given by the address pins A0 through A7. The logic level outputs from the most significant bits of the counter drive the X-decode; the outputs of the two least significant bits drive the X pre-decode. The outputs of the pre-decode are level shifted such that the selected output is at a value equal to CHV during write and equal to MHV during read. MHV is a voltage of about 12 V which is generated internally from a charge pump. Unselected outputs are taken to a low voltage. The selected X- decode connects the four pre-decode lines onto the select gates of the array row. The unselected X-decodes connect a low voltage onto the other rows. The low voltage may be VSS, but in the preferred embodiment it was chosen to be about 1.5 V—a level slightly higher than VSS. The purpose is 1) to have unselected row select gates at 1.5 V, and thus raise the voltage to which the column can be taken without experiencing a current path to substrate caused by gated diode breakdown at the drain regions formed by the column and the select gate; and 2) to increase the source voltage of undesired (field) transistors which are formed by interconnect layers (over the dielectrics intended for insulation) and the source and drain regions of desired thin-oxide transistors. Increasing the source voltage by a small amount increases the field threshold voltage required on the gate of these parasitic transistors to produce conduction in the channel region formed by the source to levels which are several volts higher than conventional levels.

It is in general good practice to eliminate these currents described in 1) and 2) above, but in any case, the source of high voltage has limited current sourcing capability and unwanted current load can prevent the source from reaching the desired high voltage levels.

There are a total of 40 X-decode circuits (See FIG. 1). Each one connects the four pre-decode lines into the array, thus providing the addressing for 160 rows. Bringing the select gate high connects the addressed row onto the columns for both write and read operations. The X-decode also allows the clear gates to be addressed. For reading and programming all clear gates may be taken to the same voltage. However, for clearing a particular row, then only that row has its clear gate taken high; the others remain at a low voltage (FIG. 6). A practical difficulty is encountered when connecting decode circuits into a memory. Since the memory is an array of cells each consisting of few transistors (in this case two) with attention given to reducing the physical size of these transistors, it is difficult to perform the physical layout of the decode circuits which interface to the array such that they "fit" into the same pitch. In the case of the column drivers, it is done by multiplexing a column driver with eight columns, therefore there is an available width equal to the width of eight columns. In the case of the X-decode, it is done by use of a pre-decode and by positioning the driving circuits for the clear gates on the opposite side of the array. Thus, only the select gates are connected into the X-decode and the select gate is then used as the input to the clear gate driver.

The purpose of the clear gate driver circuit is to apply 0 V to all clear gates during program, to connect the select gate to the clear gate during clear, connect 4 V to the selected clear gate during read and connect 0 V to the unselected gates during read. The advantage in taking only the selected clear gate to 4 V instead of the whole array is the reduced load that is applied to the circuit which generates the 4 V supply, especially since it must settle to an accurate voltage in a short time interval.

Figure 9:
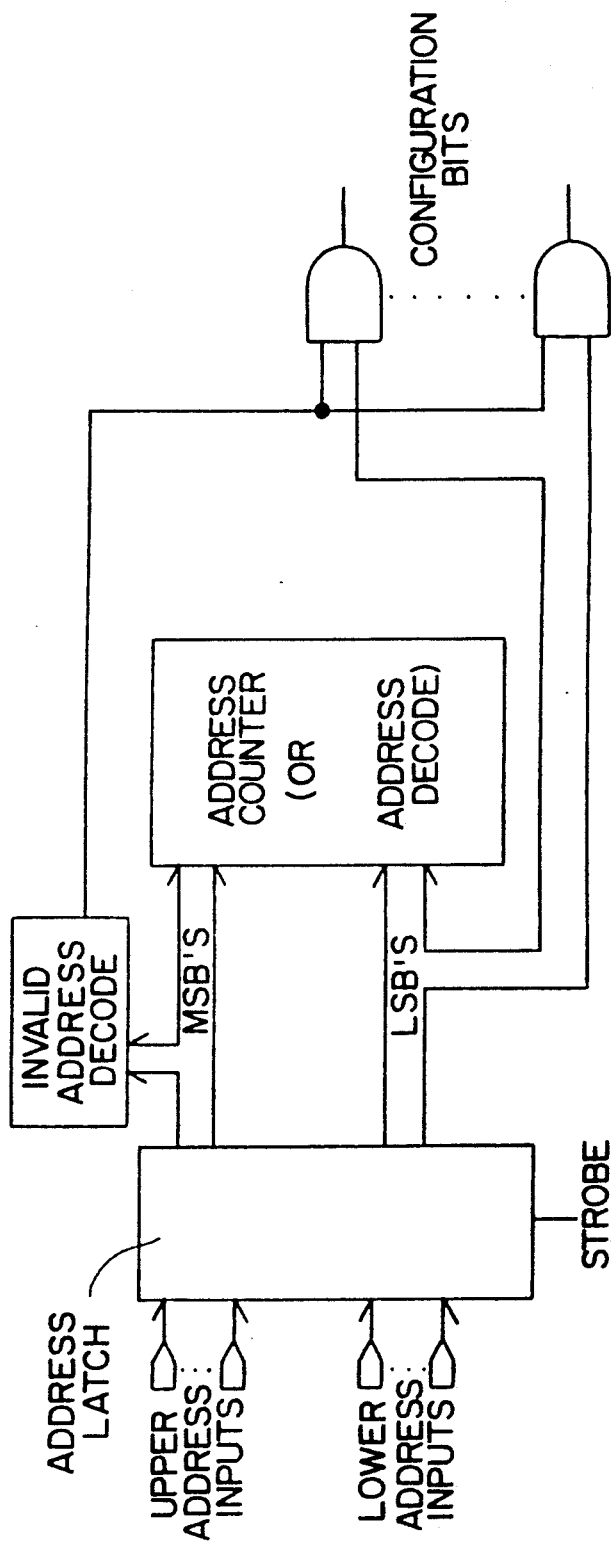
FIG. 9 is a block diagram for the circuit for detecting invalid addresses and the use of the same to control configuration bits for the integrated circuit system.
Figure 10:
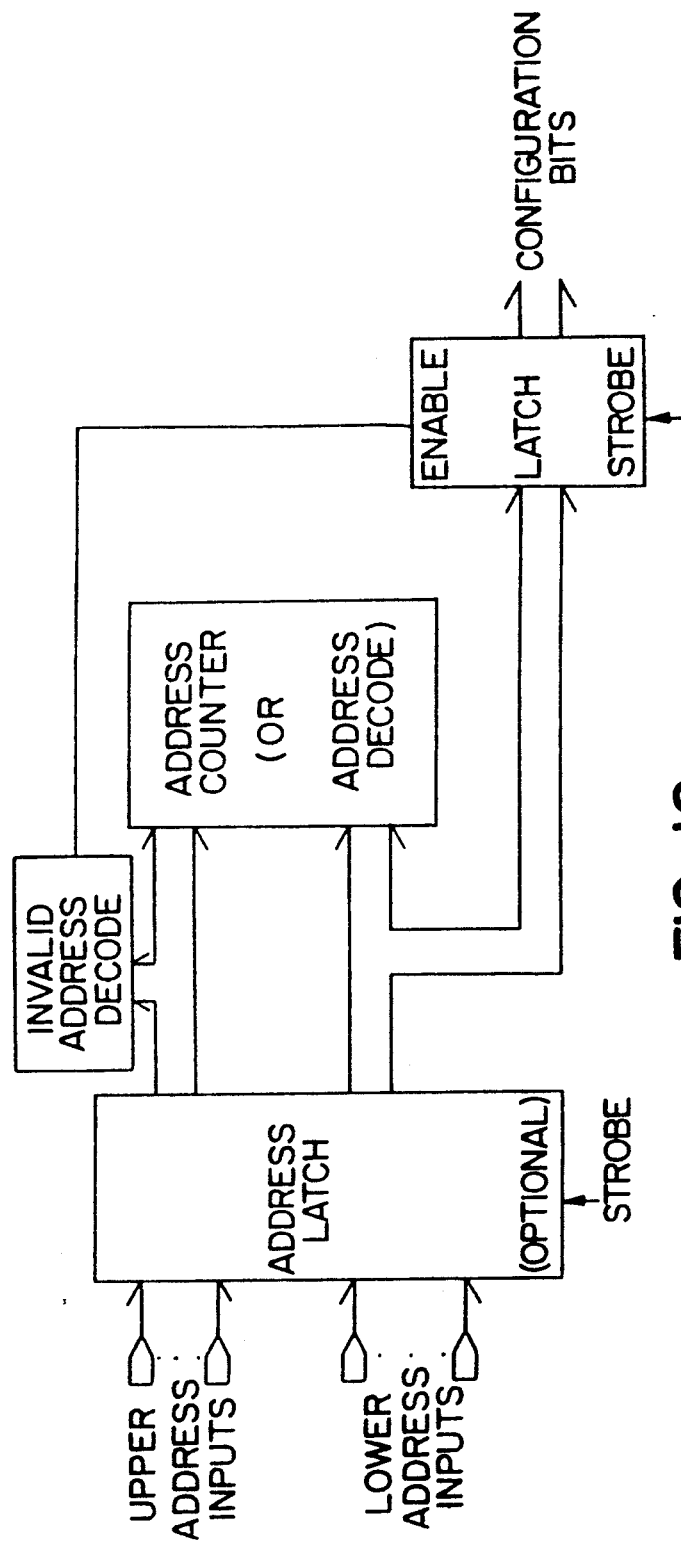
FIG. 10 illustrates a variation of FIG. 9 showing the addition of a latch to store the value of the configuration bits.

The address inputs A0 through A7 have an addressing capacity of 256. Since the total number of rows, however, is only 160, the spare capacity can be put to another use. The control input pins (PD, $\overline{CE}$, and P/R) perform specific control functions. However, different applications might prefer different behavior from the input or the output pins. The unused address capacity allows one to modify the function of the pins and therefore satisfy the needs of different applications with the same design. The higher order address bits are examined to establish whether or not the address is invalid. In the case of the preferred embodiment, if the address is greater than 159 it may be considered invalid and the lower order bits are then used to indicate that different control options are to be selected. In fact only the most significant two bits A6 and A7 are examined in the preferred embodiment. If they are both at logic "1"—corresponding to the range 192 to 255—then the lower order bits A0 through A5 are used to select control options. FIG. 9 shows the arrangement used in the preferred embodiment. The configuration bits are forced to their default state during valid addresses. For an invalid address the configuration bits are determined by the address inputs. FIG. 10 is a variation showing the addition of a latch to store the value of the configuration bits. The advantage here is that the configuration bits can be stored and then used at a later time for operations using valid addresses. In either case, additional flexibility is added to the device without the addition of extra control pins.

The address pins are also used to define test modes. To enter a test mode, a voltage higher than the voltages which the device would encounter in normal operating conditions, is applied to one of the device input pins (in the case of the preferred embodiment, the A7 pin, FIG. 1). A high voltage detector circuit is connected to this input pin to detect the presence of a high voltage and produce a signal which enables the selected test mode(s). The remaining address pins A6 through A0 are used to define the selected test modes. The purpose of the test modes is twofold—to reduce the length of time that is required to test the device and secondly to allow access to internal circuit nodes which are not otherwise directly accessible. In the first category are the test modes which cause a particular pattern to be written into the array in a reduced number of operations. This is done by enabling groups of rows and/or columns simultaneously—for example the outputs of the row counter together with their inverse signals are forced to states which select either all rows simultaneously or even numbered rows or odd numbered rows. Similarly the column counter outputs and their inverse can also be forced such that all columns or even columns or odd columns are connected into the column driver simultaneously. Since the address input states defining the condition of the column counter is independent from the states defining the condition of the row counter, the test modes for each can be selected in any combination, e.g. odd rows with even columns and visa versa. These modes allow alternating patterns such as horizontal stripes, vertical stripes, and checkerboards to be written into the complete array in a much reduced time period. The actual voltage stored in the array depends on the analog value which has been loaded into the sample and hold capacitors. In addition there are modes which inhibit the high voltage pulses reaching the array during either the clear or program cycles. In these modes all rows are selected, so the array is completely erased or completely programmed—mass erase and mass program. Such test modes allow a pattern to be loaded quickly into the array. There is also provision for reading the stored pattern at increased speeds. The sample rate during playback is increased by two possible methods—either apply high speed clocks to the external clock input to increase the basic timebase frequency, and/or enter a test mode which by-passes some of the stages of the dividing chain which creates the sample frequency. In either case, the filter is removed from the playback signal path by connecting the output of the differencing amplifier into the power amplifier. This is necessary since the filter would bandlimit at a frequency which is less than the output data rate. A test mode is also provided for connection of the filter input and output to device pins, thus allowing for more direct tests of the filter characteristics. Access to the internal nodes VCCA and CHV is provided by high voltage switches which connect either these nodes to a device pin (P/$\overline{R}$) on selection of the appropriate test mode. To facilitate the measurement of actual stored voltages and their variation, a test mode causes the DIFREF input into the differencing amplifier to be forced to VAGND.

The input logic receives input from the input pads PD, $\overline{CE}$ and P/$\overline{R}$. These are acronyms for power down, CHIP ENABLE, and PLAYBACK/$\overline{RECORD}$. Inputs are also received from internal signals-power-on-reset (POR), configuration bits, LOVCC (a signal which becomes active when VCC is below a certain level), the EOM column outputs, and a switch debounce clock from the column multiplex counter. Control signals from the input logic are distributed to various parts of the IC to control power down, the enable and reset of various blocks, the writing of EOM markers, the latching of address inputs and the selection of record and playback modes. The configuration bits select options between various control options; whether $\overline{CE}$ is edge sensitive or level sensitive; whether the row counter is reset at the beginning of each operation or only when changing from record to playback or playback to record; whether playback stops or continues when the signal from the EOM column becomes active; whether the $\overline{EOM}$ output pad pulses low at EOM and overflow of the address counter or only at overflow of the address counter; whether the EOM markers are retained or deleted by the next message; and whether the playback speed is normal or at an accelerated rate. These various operation modes can be selected in any combination as described earlier, depending on the state of the address pins. The accelerated playback rate (or fast forward mode) can be used by the external controller to locate the positions or addresses of an end of message. In this mode the modulus of the dividing chain is reduced by bypassing some of the stages—in the case of the preferred embodiment the column register is bypassed and an acceleration factor of 100× is achieved. The audio output is disabled but the EOM markers still produce a pulse at the $\overline{EOM}$ output pad. The device is put into the fast forward and the controller measures the time or records the number of external clock pulses at which the $\overline{EOM}$ outputs appear. The addresses of the next locations would be the start addresses of the subsequent messages and can be calculated from the time or the clock count. This address can then be input to the address pins, the address counter preset to this value and the playback begun from this point. Alternately the controller may use the fast forward mode to quickly move to the end of a particular message and then, without changing the address counter, begin a normal playback of the next message. Since the audio output is disabled during fast forward, the audio output begins at the start of this next message. In this way the controller is not required to have a record of the array locations or addresses corresponding to the beginning or the end of the messages. Instead, all that is required to be known is the order in which the messages appear and for the recordings to be continuous without any spurious or residual EOM markers. This is achieved by recording the messages in a continuous manner or by careful management of addressing during recording. The device is configured into the fast forward mode (resetting the address counter) and as the $\overline{EOM}$ pulses appear they are counted by the controller. When the $\overline{EOM}$ pulse belonging to the message previous to the desired message is encountered the chip is disabled and then put into the normal playback mode without resetting the address counter. The desired message is then played back. The arrangement is particularly effective if the fast forward acceleration is high so that the delay between initiating the search and the beginning of playback is short.

The input logic also allows the device to be disabled, by bringing $\overline{CE}$ high, and enabling the device again without loss of the contents of the address counter. During playback this would be similar to the "Pause" feature found on other types of record instruments.

During power down mode i.e. PD pin high, all possible steps are taken to reduce power consumption, including turning off the DC current bias sources for the analog section. On power up, however, there is a finite time required for the analog voltages and references to settle. In particular the connections to external pins (e.g. MICIN and AGC) have relatively large capacitances to drive and require a fairly long settling time. It is desirable to have these voltages settle before making a recording. After bringing PD low and coming out of power down, the device uses the timebase and dividing chain to provide a settling period (25 milliseconds) before allowing the device to respond to a $\overline{CE}$ input.

Figure 11:
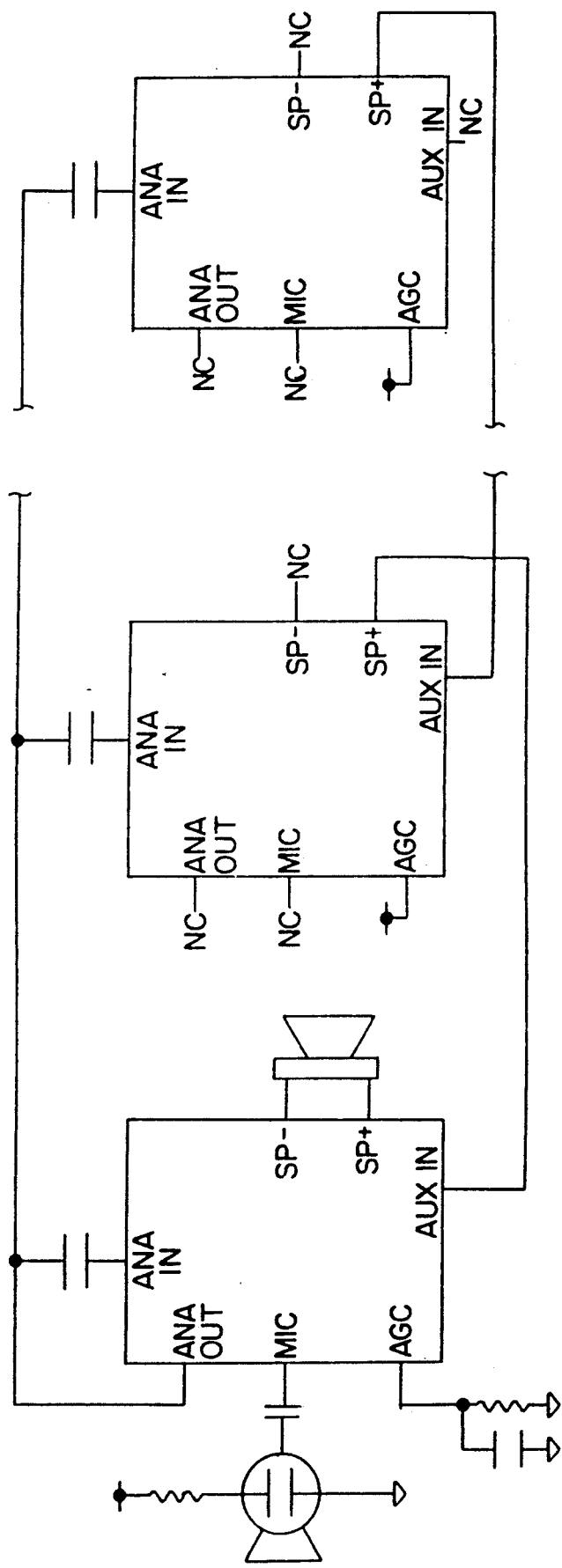
FIG. 11 shows the analog connections for connecting several devices to a single microphone, AGC resistor and capacitor, and loudspeaker for cascading multiple devices to extend the record and/or playback time in a simple and efficient manner.

The input logic and the analog circuits allow more than one device to be connected (or cascaded) together in order to extend the record duration. FIG. 11 shows the analog connections for connecting several devices to a single microphone, AGC resistor and capacitor, and loudspeaker. The ANAOUT of one device is capacitively coupled to each of the other devices, as well as to itself. The number of devices that can be driven by a single preamplifier output depends on the drive capability of the circuits driving the ANAOUT pin. If additional drive capability is required then an external analog buffer can be connected between the ANAOUT pin and the coupling capacitors. The loudspeaker, unlike the microphone, must be connected to the first device in the chain. All devices are powered up together, but only one device is active at any one time. The $\overline{EOM}$ output is connected to the $\overline{CE}$ of the next successive device in the chain such that, as one device reaches its capacity and the address counter reaches the maximum valid address, the $\overline{EOM}$ pad goes low to select the next device. During playback, to maintain the pause feature without changing the device which is active, once a device has reached capacity it must continue to produce a low level on $\overline{EOM}$. With such a connection scheme the $\overline{EOM}$ pulses due to end of message markers must be inhibited, as otherwise they will be interpreted by the next device as an enable command. This is available on the device as one of the configuration modes. Another event which occurs as the device reaches capacity during playback takes place at the power amplifier multiplexer. As well as taking $\overline{EOM}$ low, the multiplexer is switched from the internal source to the external pin. The gain of the power amplifier from AUXIN to SP+ is unity, so the output from the active device is passed through each previous device in the chain until it reaches the first device, which drives the loudspeaker.

The AUXIN input to the power amplifier is also selected when the device is deselected due to a high level on $\overline{CE}$. This allows the use of the power amplifier by other parts of a system which doesn't necessarily use cascading.

The high voltage generation is performed by on-chip circuits —there is no need to provide external sources or perform external regulation or waveshaping. A high speed oscillator is buffered to produce two-phase pulse sources before being input to the voltage multiplying charge pumps—CHARGE PUMP, MHV and VDBL. There are no special steps taken to make the phases non-overlapping; however, for optimum operation, the time duration which the two phases spend at opposite voltages is maximized. During time periods in which the sensitive analog operations are performed e.g. during sample and compare periods, the high speed oscillator is disabled to minimize the amount of noise coupled onto the sensitive nodes. The charge pump which creates the signal CHV is the one used for writing into the array. There is no attempt made to control CHV at the pump itself; the control is done by two shunt elements—the RAMP LIMIT circuit and HV INC. Both of these shunt circuits operate on the principle of voltage regulation by controlling a shunt current to the negative supply (VSS). The MHV pump creates a voltage of about 12 V to assist in eliminating gated diode breakdown of high voltage nodes. It is also used in the read path to reduce the impedance of transistors which cannot be made physically large due to layout constraints. For instance the column multiplex transistors and the select gates should be a low resistance to minimize unwanted voltage drops in the voltage follower path. The VDBL voltage is required in the MOSFET-R control circuit to extend the range of the control voltage.

It is known that higher tunnel currents reduce the endurance of the tunnel oxide (the number of times that the voltage level on the floating gate can be changed from erased levels to programmed levels and visa versa). With increasing number of erase/program cycles the difference in threshold voltage between erase and program states appears to reduce—a particular problem for digital memories that apply pre-determined program pulses and compare cell characteristics against a fixed reference. This is thought to be due to electron trapping in the tunnel oxide which creates opposition to the field creating the tunnel current. Moreover, it is thought that higher tunnel current increases the likelihood of blowout of the tunnel oxide. It is therefore desirable to reduce the tunnel currents to a minimum. This is done by reducing the rate of change of voltage across the tunnel oxide i.e. reducing the ramp rate of CHV.

The conflict, however, is that it is also desirable to include as many high voltage pulses as possible in the program cycle in order to improve storage resolution—this would imply a fast ramp rate for CHV. The purpose of the RAMP LIMIT circuit is to help resolve this conflict. During the clear pulse, the addressed cells are being taken from a programmed condition to an erased condition. Tunnel current is likely to be high because of the relatively large change in floating gate voltage and large voltage difference across the tunnel oxide. It is therefore important in this case to limit CHV to a slow ramp rate—this allows the floating gate voltage to "track" the slowly increasing clear gate voltage with a smaller tunnel current. During the coarse program cycle, however, the cell undergoes incremental changes in programming voltage. The corresponding increment on the floating gate is small and the tunnel current is also small. In the case of the coarse program cycle, then, since the tunnel current is limited by the small increments of the peak voltage of CHV, there is no need to limit the ramp rate. The ramp can be made quite steep, thus allowing the CHV pulse width to be reduced and consequently increase the number of pulses that can be included in the coarse cycle. Similarly the fine cycle has even smaller increments of high voltage applied to the cell and by the same argument the ramp rate can be higher and the pulse width smaller.

The purpose of the RAMP LIMIT circuit is to provide a variable ramp rate, depending on the present control mode (clear, coarse or fine)—pulse width control is performed by the timing circuits. The concept of a ramp limiter and the circuit to realize it has been used in digital EEPROMS by others. However, the improvement here is the variable slope and also the use of current references from the analog bias generator.

Figure 12:
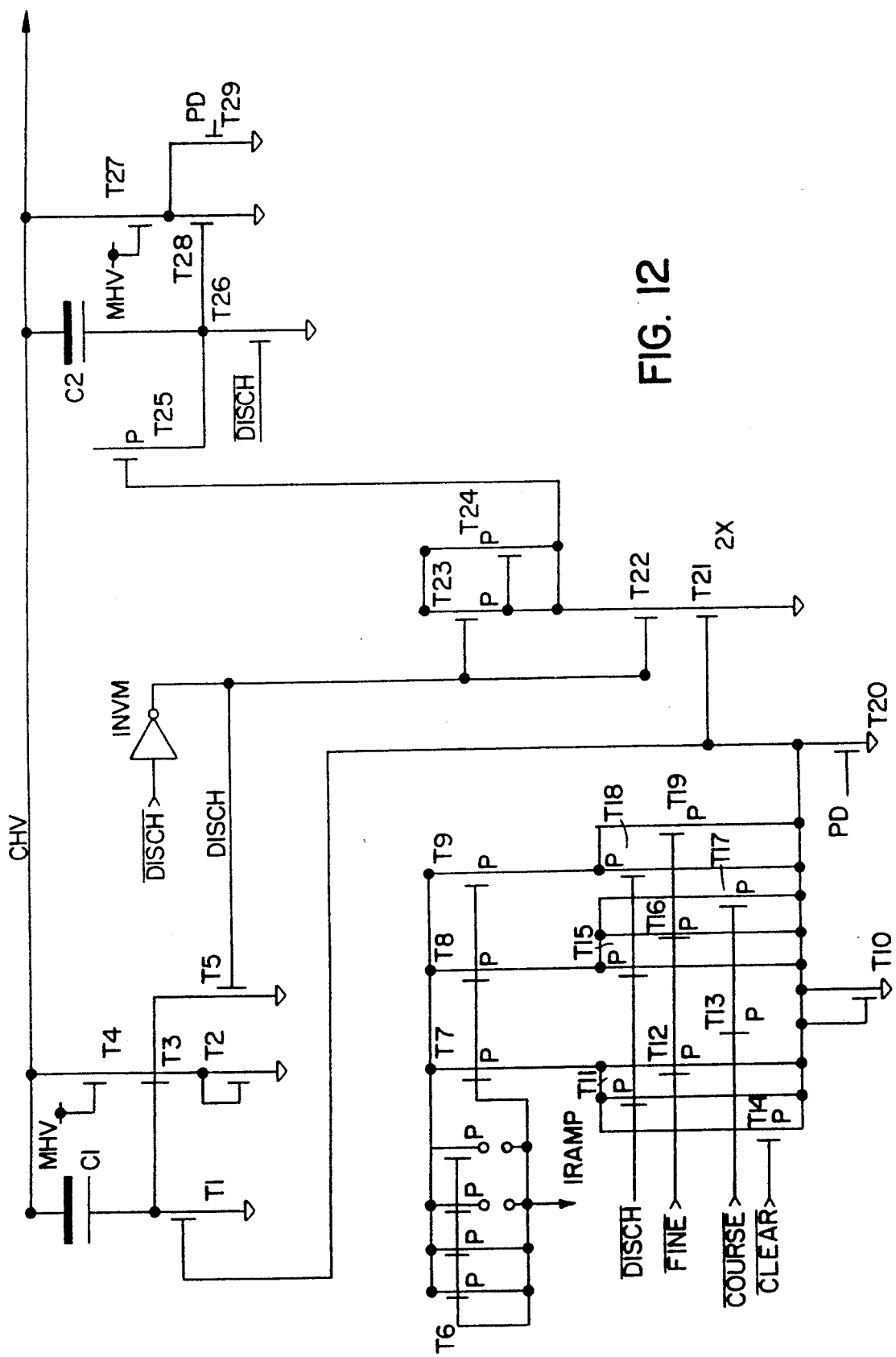
FIG 12 is a circuit diagram for the high voltage ramp up and ramp down circuit used in the preferred embodiment.

The ramp rate is determined by the current flowing in T1 (See FIG. 12). As CHV rises, so the capacitor C1 couples a current, onto the drain of T1. If this current is greater than the T1 drain current, then the voltage on T1 drain increases. T3 turns on and shunts current from CHV through T4, T3, and T2 to VSS. Since the CHV voltage has a limited source current (it actually has a high equivalent internal resistance of the order of tens or hundreds of kilohms for practical charge pumps and pulse sources) the voltage increase begins to slow down. This reduces the current through C1, the voltage on the gate of T3 reduces and CHV ramp rate increases. The circuit actually stabilizes so that the current through C1 is equal to the current through T1. The purpose of T4 is to limit the drain voltage on T3 so that a gated diode breakdown path does not occur (this would limit the maximum voltage attainable by CHV). T4 does not create a gated diode path since its gate is at MHV, which in turn is maintained at about 12 V. The purpose of T2 is to increase the voltage which CHV reaches before the T3 turns on and the limit action begins.

The improvements are incorporated in transistors T6 through T20. A current reference IRAMP is received from the current bias generator and mirrored into transistors T7, T8 and T9. Transistor dimensions are all equal so that electrical characteristics are matched, but the number of component structures incorporated in each transistor is ratioed to provide a ratio of currents. Thus the current available from T7, T8, and T9 depends on the number of individual components making up each transistor. Transistors T11 through T19 are switching transistors that enable or disable the available current from T7 through T9 to flow into T10. Thus the current flowing into the drain of T10 depends on the state of the signals $\overline{DISCH}$, $\overline{FINE}$, $\overline{COURSE}$, $\overline{CLEAR}$. The preferred implementation produces the current ratio 10:10:5:1 for $\overline{DISCH}$:$\overline{FINE}$:$\overline{COURSE}$:$\overline{CLEAR}$. The current through T10 is mirrored onto T1 and therefore controls the positive going ramp rate of CHV. The current mirrors could be implemented in n-channel transistors referenced to VSS, with switches implemented in n-channel transistors or n and p-channel transistors. Also the control signals may not necessarily be dedicated to a particular mode—it is possible for a coded set of input signals to be applied. In other words the general description would be a set of ratioed current sources with a means to selectively direct each of these currents into one transistor which is then mirrored into the ramp limit circuit.

Another section of the RAMP LIMIT circuit consists of T21 through T29 and C2. This section controls the rate at which CHV ramps down. It is desirable to control the ramp down rate so that the disturbance created by discharging the large capacitance connected to CHV is reduced. However, the node must be discharged fairly quickly (about 2 μsecs), in keeping with the need for a large number of CHV pulses. The discharge transistors T27 and T28 must therefore have a high current sink capability but nevertheless must not be allowed to operate in an uncontrolled fashion. The ramp down circuit operates in a similar fashion to the ramp up circuit. When the circuit is controlling, the current through C2 is equal to the current through T25. The signal $\overline{DISCH}$ goes to a low level, allowing the gate of T28 to rise and thus discharge CHV. As CHV falls, the coupling through C2 maintains a gate voltage on T28 and a discharge rate of CHV such that the current through C2 is equal to the current through T25.

Figure 13:
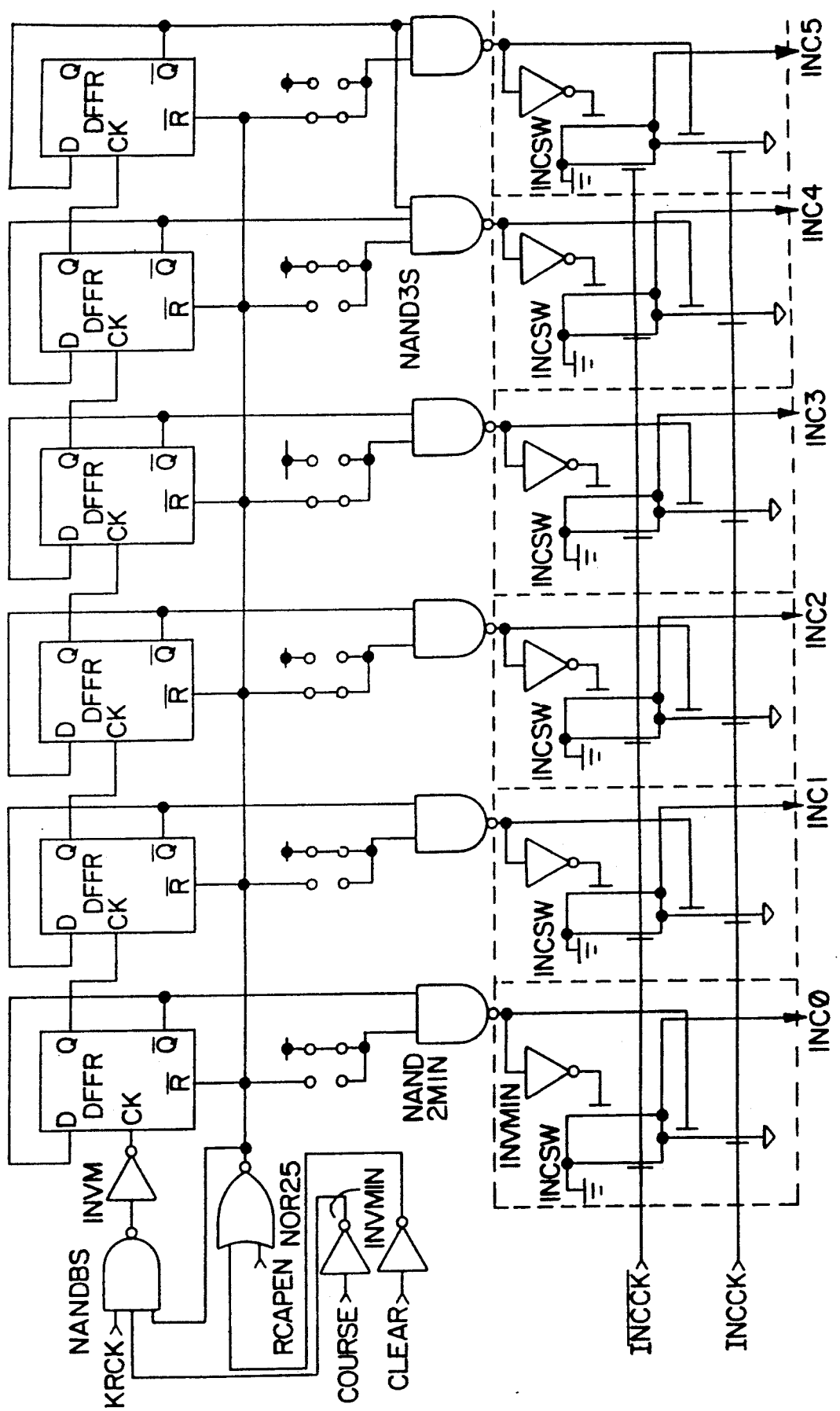
FIG. 13 is a circuit diagram of a binary counter and analog switches of the HV INC circuit.
Figure 14:
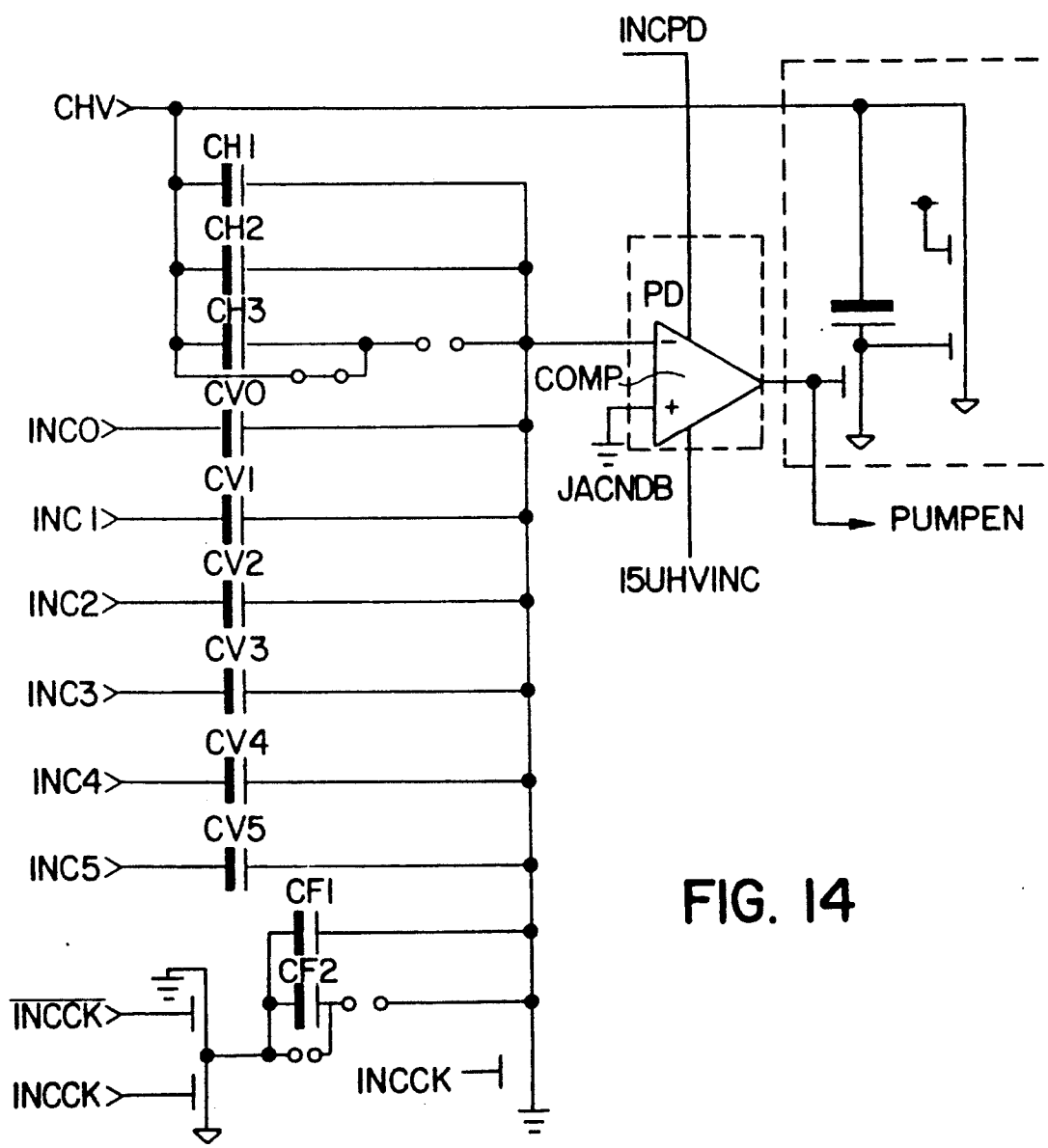
FIG. 14 is a circuit diagram of the capacitors and comparator of the HV INC circuit.

The writing algorithm requires a high voltage which is incremented during each coarse pulse, and be at a fixed level during the clear and fine cycles. This function is performed by the HV INC circuit. It consists of a binary counter and analog switches shown in FIG. 13 and capacitors and comparator in FIG. 14.

During the clear cycle, the signal $\overline{CLEAR}$ is low. This resets the six-bit counter, setting all the $\overline{Q}$ outputs high. The outputs of the nand gates at this time depend on the positions of switches SW0 through SW5—these are metal options that are set during manufacturing and cannot be changed afterwards. The signal INCCK changes state from low to high (as it does at the beginning of each high voltage pulse)—$\overline{INCCK}$ is the inverse signal and is non-overlapping with INCCK. Thus the signals INC0 through INC5 change from VAGND (1.5 V) to VSS depending on the output of the nand gates —if the nand gate output is high then the INC output switches from VAGND to VSS; if the nand gate output is low then the INC output remains at VAGND. The INC signals are applied to capacitors CV0 through CV5 of FIG. 14, the input to capacitor CF is switched from VAGND to VSS, the inverting input to the comparator which had previously been charged to VAGND is released, and since CHV is not changing at this time, there is a resultant negative voltage transition on the inverting input to the comparator and consequently its output PUMPEN goes high. CHV, which had previously been held at VSS, is now allowed to rise (under control of the RAMP LIMIT circuit). This couples a positive-going voltage into the inverting input of the comparator. The amount of charge coupled is equal to the product of CHV and the capacitor CH. CHV continues to rise until the positive charge coupled onto the comparator is equal to the negative charge coupled through the CV capacitors and CF. At this time the comparator output PUMPEN goes low and inhibits further increase of CHV. This can be done by either inhibiting the pump or by a voltage clamp circuit. In the former case, any drop in CHV voltage (due to leakage for instance) will cause PUMPEN to go high, enable the pump and return CHV to the previous level which caused the comparator to switch. Hence CHV voltage is held at a level determined by the initial charge coupled into the comparator when INCCK first went high. Loss of charge due to leakage or other causes must be small relative to the capacitively coupled charge for steady regulation of CHV—which is the case for the fairly short time periods involved (a few milliseconds maximum). At the end of a high voltage pulse, the pump is disabled, CHV is ramped down and INCCK is taken low ready for the next pulse.

The minimum level of CHV occurs when all the inputs to the CV capacitors remain at VAGND i.e. when all the counter bits are reset, the $\overline{RESET}$ signal is high and all the nand outputs are low as occurs at the beginning of the coarse cycle. CHV voltage at this time is determined by the ratio of CF and CH and the value of VAGND. The counter is incremented before each high voltage pulse in the coarse cycle and a negative going pulse is applied to the CV capacitor if the corresponding bit of the counter is set. The values of the CV capacitors are weighted to give the desired increments to CHV. During the fine cycle, the counter does not receive any clock pulses and the counter value remains at the maximum count attained at the end of the coarse cycle. At the beginning of each coarse cycle the counter is reset.

The voltage reference VAGND is derived from a bandgap reference and is therefore extremely stable with VCC and temperature and is unaffected by age and the number of write cycles. Absolute voltage accuracy is adequate, but can be made more precise if necessary by use of the trim bits.

Figure 15:
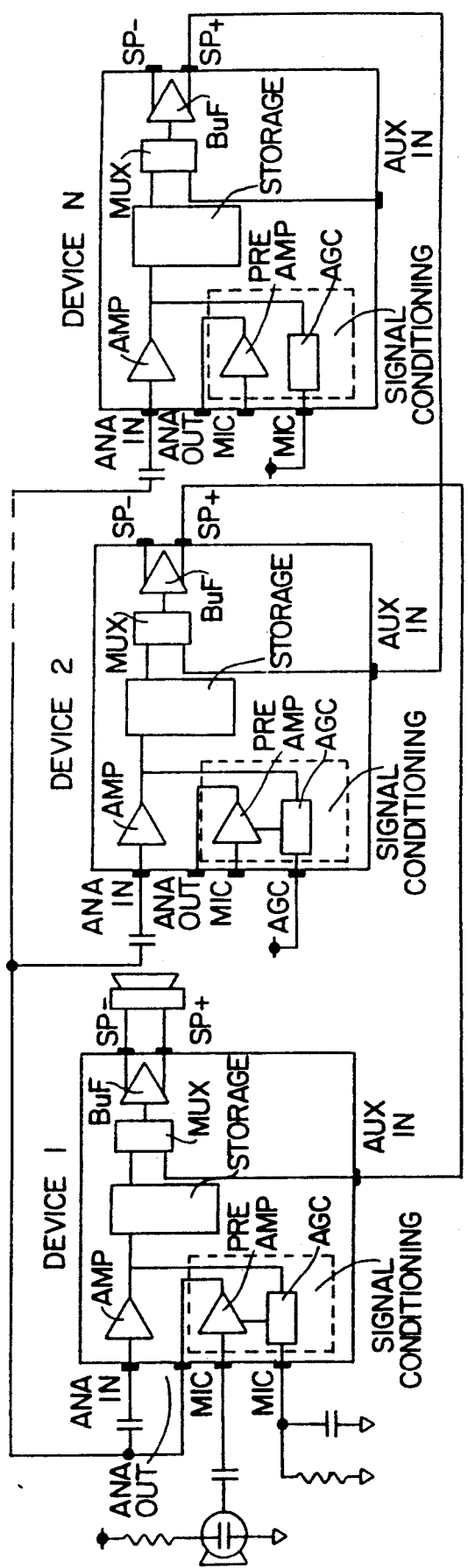
FIG. 15 is a circuit diagram for the analog connections of cascaded multiple devices to extend the record and playback time in a simple and efficient manner.

FIG. 15 shows the analog connections for cascading the foregoing integrated circuits to extend the recording and playback capacity of such a system. The leftmost device (device 1) is connected to a microphone, AGC resistor, AGC capacitor, ANA IN coupling capacitor and loudspeaker (device 1 could function as a single chip voice record and playback system in this configuration). Other devices are added by connecting the ANA OUT of device 1 via a capacitor to the ANA IN of each additional device. The purpose of the capacitor is to couple an a.c. signal onto the internally biased reference level present on the ANA IN pin. Since each device generates its own internal reference level, the capacitors allow the reference levels to be different without introducing offsets. This technique requires the loudspeaker to be on device 1. However, the microphone and AGC network may be connected to any device in the chain. The ANA OUT must be capable of driving all N devices over the bandwidth; if it is not, then an external buffer may be used to increase the drive capability.

The speaker is driven by device 1. Subsequent devices in the chain have their SP+ outputs connected to the AUX IN of its preceding device in the chain. Only one device in the chain is considered active at any time. The control method which performs the device selection is described later. During record, the signal to be recorded is present on all ANA IN pins, but only the selected device has its storage circuits enabled and only that device writes the signal into memory. During playback, the single selected device has the storage output directed into the output buffer by the multiplexer—all other devices have their AUX IN input directed into the output buffer. Hence, device 1 drives the speaker directly when it is selected. All other devices, when they are selected, drive the speaker through the AUX IN, buffer, and SP+ of each preceding device in the chain. The AUX IN, buffer, SP+ path in each device must be unity for satisfactory playback.

Figure 16:
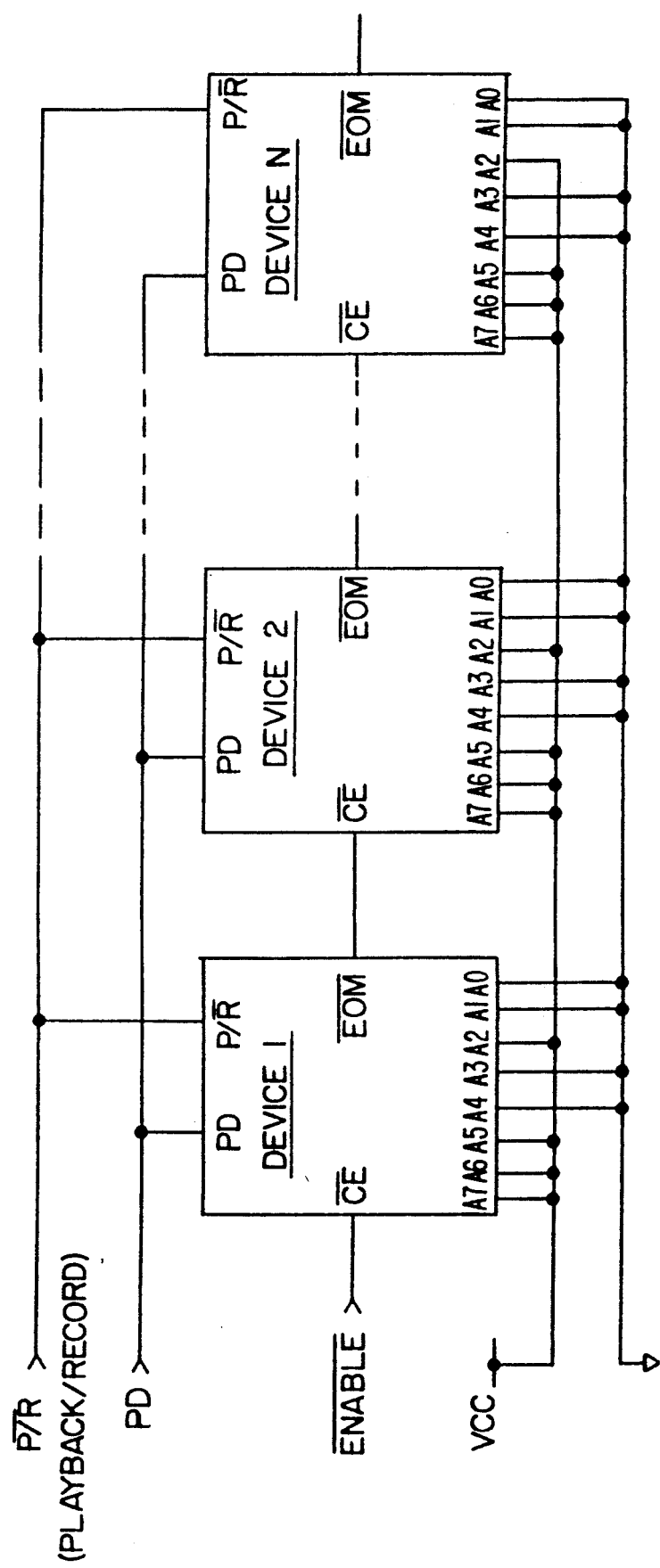
FIG. 16 is a circuit diagram for the digital connection of the most simple control configuration of cascaded multiple devices to extend the record and playback time in a simple and efficient manner.

FIG. 16 shows the control connections for multiple devices. The $\overline{CE}$ (Chip Enable) pin of each device is connected to the $\overline{\text{EOM}}$ (End Of Message) pin of the previous device. The exception is the first device which has its $\overline{\text{CE}}$ pin connected to an external control signal. This control signal requests or enables an operation and may originate from a simple push-button switch or from a microprocessor. The enabling of individual devices is performed automatically by internal logic and the simple connection of $\overline{\text{CE}}$ and $\overline{\text{EOM}}$ pins, without any external intervention or assistance. When either a record or a playback operation is taking place, the addressing of internal memory is done sequentially. After each sample is taken the internal counters are incremented to address the next memory location or group of locations. If the counter reaches a value corresponding to the maximum address location, thus indicating that the device has reached the limit of its storage capability, then the control logic causes the $\overline{\text{EOM}}$ pad to go low. This indicates to the succeeding device in the chain that it is now the selected device. Selection of subsequent devices continues until the last device in the chain brings its $\overline{\text{EOM}}$ pad low. This can then be used as an indicator to the system controller that the total system capacity has been exhausted—e.g. the last $\overline{\text{EOM}}$ may be returned to the microcontroller or may be used to light a LED or some other visual or audible indicator. Several variations on the exact behavior are possible. If the system request is withdrawn i.e. if the input $\overline{\text{CE}}$ is taken high, the operation would terminate and recommence from the beginning at the next request. Alternatively, the operation may recommence from the location at which it was previously terminated—reset to the beginning would then be done by another control pin. In the example shown here, the PD (Power Down) pin performs the reset function, as well as powering down the device into a standby mode.

The example herein utilizes multiple sample and hold circuits during the writing into the storage area, as described in U.S. Pat. No. 4,890,259. This is somewhat similar to page mode in digital non-volatile memories and, as a consequence there is a special requirement that must be fulfilled. During playback the procedure is fairly simple—the $\overline{\text{EOM}}$ pin is taken low exactly when the last stored sample is output and the next device continues without interruption. The fine timing between $\overline{\text{CE}}$, the internal sample clock and $\overline{\text{EOM}}$ is organized so as to make the transition from one device to the next appear continuous without any discontinuity. During recording, however, the procedure is a little more complicated. The dual multiplicity of sample and hold circuits require that $\overline{\text{EOM}}$ be brought low earlier than the writing of the last sample by an amount equal to the time needed to load one multiplicity of sample and hold circuits. This is because the sample and hold circuits must be loaded before the actual writing process takes place. For the recording to appear continuous, the loading of the sample and holds in the newly selected device must begin at the same time that the writing of the previous samples begins in the preceding device.

Because of the analog reference system used in the present invention, the invention is further useful for implementing a digital memory integrated circuit where the implementation of the digital memory is such that the digital information is encoded as analog information such as voltage levels to be stored in the nonvolatile cells of the analog memory array. Such encoding can be done off the memory chip by a digital to analog converter, or the chip could be modified to provide such encoding on the memory chip. The digital information is recovered from the analog storage array by presenting the analog levels from the nonvolatile analog storage array to an analog to digital converter and outputting the digital information such as a nibble or byte or other combination of digital information. As is the case with the digital to analog converter, the analog to digital converter also may or may not be fabricated on the same integrated circuit as the nonvolatile analog memory array and analog recording apparatus.

It may be seen from the foregoing that the $\overline{\text{EOM}}$ signal, or rather more specifically the signal appearing on the $\overline{\text{EOM}}$ pad or terminal, has various characteristics depending upon the mode of operation of the devices. In particular, the $\overline{\text{EOM}}$ signal is normally programmed to be activated (to go low) at the end of messages which end within the storage space of the individual devices. When cascading devices however, this function is first disabled by mode control as herein before described. In the read mode, the $\overline{\text{EOM}}$ signal acts as an overflow signal responsive to the address counter to go low when the address counter reaches decimal 160. Thus, since there are 160 lines of storage cells in the exemplary embodiment numbered decimal 0 through 159, the incrementing of the address counter after the last output of row 159 will toggle the $\overline{\text{EOM}}$ signal low, enabling the next device in the chain (see FIG. 16).

In the write mode, as previously pointed out, a plurality of signal samples are sequentially taken and then, as a subsequent plurality are being taken, the prior plurality are written to memory through the iterative write process herein before described. Consequently, for a continuous write (continuous sequential sampling) between devices, it is necessary to start taking samples by the subsequent device as the prior device is writing the last plurality of samples to memory. Consequently, for the exemplary embodiment hereinbefore described, it is necessary for the $\overline{\text{CE}}$ signal of the next device (see FIG. 16) to go low 12.5 milliseconds before the address counter of the prior device goes into the overflow condition (decimal 160). Thus, for purposes of the write mode, the $\overline{\text{EOM}}$ signal, as an advanced form of the overflow, is based upon the decoding of both the address counter and the column multiplexer so that the $\overline{\text{EOM}}$ signal will go low after the addressing of the last signal storage column of the last row of the storage matrix. Once toggled low, the $\overline{\text{EOM}}$ signal, as used as an overflow signal during read and write operations as described, will remain low, only resetting on power down (PD).

Thus, during a write operation, samples of an input signal are sequentially taken by the first device and stored a plurality at a time by the iterative write process, the second device picking up the sequential sampling without any gaps upon the completion of the sampling for the first device, even though the first device is still proceeding with the iterative writing of the plurality of samples to memory as the next device is taking its initial plurality of samples. During reading, the operation of the cascaded devices is simpler in the sense that when one device has been fully read, the next device will immediately start reading from the beginning thereof so as to provide a continuous read, device to device, as desired.

It may be seen from FIG. 15 that the cascading of devices in the manner described provides an exceptionally simple system for the recording and playback of analog signals of quite substantial duration by the mere cascading of identical devices, for recording merely needing a microphone, telephone or other analog signal output device, and for playback merely needing a speaker attached thereto. For playback, the speaker is connected to the first device and upon initiation thereof plays back the analog information stored in the first device, immediately followed by the information stored in the second device, etc., the multiplexer (FIG. 15) in each device shifting from the output of that device to the AUXIN input when the $\overline{\text{EOM}}$ signal goes low on overflow. Since the gain of the output amplifier in each device is unity, daisy chaining the outputs of multiple devices back to the first device does not result in any significant loss (or gain) of signal. With respect to the input for recording, the preamplifier and automatic gain control section of any device may be used for this purpose.

With respect to the control of the multiple devices, a simplest form of control is illustrated in FIG. 16. In essence for a full playback and record control capability, only 3 signals are required, namely the Power Down signal PD, which on going high will put all devices in a minimum power dissipation mode and reset $\overline{\text{EOM}}$, and upon going low will ready the devices for the playback or record mode, depending upon the state of the control signal P/$\overline{\text{R}}$. Upon power up plus proper setting of the playback/record signal P/$\overline{\text{R}}$, playback or record is initiated by pulling $\overline{\text{ENABLE}}$ low, with one device recording or playing back after another until subsequent power down or the total capacity of all cascaded devices has been reached. Note that while in the preferred embodiment the individual devices have other capabilities, such as signalling the end of message at intermediate points in their storage capacity as enabled by other modes, the mode settings for the cascading of FIG. 15 and 16 are modes which are set by use of the invalid address space, i.e. address 160 and above, as described previously herein, the specific address used in the preferred embodiment as illustrated in FIG. 16 by the tieing of each of the address bits to VCC or ground being binary address 11100100 or decimal 228.

While the preferred embodiment of the present invention has been disclosed and described herein, it will be obvious to those skilled in the art that various changes in form and detail may be made therein without departing from the spirit and scope thereof.

I claim:

1. Cascaded analog record/playback devices for extending the continuous recording and the playback duration beyond the duration of individual devices comprising:
   a plurality of integrated circuit record/playback devices, each having;
      a plurality of storage cells, each for storing a sample of an input signal;
      an input means coupled to a signal input terminal and to the plurality of storage cells for providing samples of the input signal to the storage cells;
      a multiplexer having a first input thereto coupled to the plurality of storage cells and an output thereof coupled to a first output terminal for providing stored samples of the input signal as read from the storage cells to the first output terminal when the multiplexer is set to couple the storage cells to the first output terminal;
      an auxiliary input terminal coupled to the multiplexer as a second input thereto, the gain between the auxiliary input terminal and the first output terminal when the multiplexer is set to couple the auxiliary input terminal to the first output terminal being substantially unity;
   means for causing the multiplexer to couple the first input thereto to the first output terminal when the samples stored in the storage cells of the device are being played back and to switch the multiplexer to couple the auxiliary input terminal to the first output terminal after the sample stored in the last storage cell of the device has been played back;
   input coupling means for coupling the signal input terminal of each of the plurality of devices together;
   each of the plurality of devices after the first having its first output terminal coupled to the auxiliary input terminal of the preceding device;
   means coupling the input coupling means to a signal source; and,
   analog signal utilization means coupled to the first output terminal of the first device.

2. The improvement of claim 1 wherein the signal source is a microphone.

3. The improvement of claim 2 wherein the signal utilization means is an audio speaker.

4. The improvement of claim 3 wherein each of the plurality of integrated circuit record/playback devices further has;
   a second output terminal; and
   means coupled to the first and second output terminals for providing signals of equal amplitude and opposite phase thereon;
   and wherein the speaker means is coupled directly between the first and second output terminals of the first device.

5. The improvement of claim 1 wherein:
   each of the plurality of integrated circuit record/playback devices further has an automatic gain control circuit therein, the input of the automatic gain control circuit being coupled to an automatic gain control circuit input terminal and the output of the automatic gain control circuit being coupled to an automatic gain control circuit output terminal;
   and wherein the automatic gain control circuit input terminal of one of the devices is coupled to the signal source and the automatic gain control circuit output terminal of the same device is coupled to the input coupling means.

6. Cascaded analog playback devices for extending the continuous playback duration beyond the duration of individual devices comprising:
   a plurality of integrated circuit playback devices, each having;
      a plurality of storage cells, each having stored therein a sample of an analog signal;
      a multiplexer having a first input thereto coupled to the plurality of storage cells and an output thereof coupled to a first output terminal for providing samples read from the storage cells to the first output terminal when the multiplexer is set to couple the storage cells to the first output terminal;
      an auxiliary input terminal coupled to the multiplexer as a second input thereto, the gain between the auxiliary input terminal and the first output terminal when the multiplexer is set to couple the auxiliary input terminal to the first output terminal being substantially unity;

means for causing the multiplexer to couple the first input thereto to the first output terminal when the samples stored in the storage cells of the device are being played back and to switch the multiplexer to couple the auxiliary input terminal to the first output terminal after the sample stored in the last storage cell of the device has been played back;

each of the plurality of devices after the first having its first output terminal coupled to the auxiliary input terminal of the preceding device; and, analog signal utilization means coupled to the first output terminal of the first device.

7. The improvement of claim 6 wherein the signal utilization means is an audio speaker and the samples stored in the storage cells are samples of an analog signal.

8. The improvement of claim 7 wherein each of the plurality of integrated circuit record/playback devices further has;

a second output terminal; and means coupled to the first and second output terminals for providing signals of equal amplitude and opposite phase thereon;

and wherein the speaker means is coupled directly between the first and second output terminals of the first device.

9. Cascaded analog record/playback devices for extending the continuous recording and the playback duration beyond the duration of individual devices comprising:

a plurality of integrated circuit record/playback devices, each having;

a plurality of storage cells for storing samples of an input signal and playing back the same responsive to a chip enable signal;

an enable terminal for receiving the chip enable signal for causing the sequential recording or playback of samples of the input signal;

an end of message terminal for providing an end of message signal indicative when active that the last storable sample of the input signal has been taken during record or that the last stored sample has been read out during playback;

the end of message terminal of each device other than the last of the cascaded devices being coupled to the chip enable signal of the next device, whereby on recording or playback, the first of the cascaded devices, when enabled by a signal on its enable terminal, will take and record samples of the input signal or play back the same, the end of message signal of each device enabling the next successive cascaded device so that recording or playback of samples is uninterrupted as the same progresses from device to device.

10. The cascaded analog record/playback devices of claim 9 wherein each device further has a power down terminal for reducing the power consumption of the device when not active and a playback/record terminal for setting the device for playback or read depending on the state of the signal on the playback/record terminal, and wherein the power down terminals of all devices are connected together and the playback/record terminals of all devices are connected together, whereby a single power down signal and a single playback/record signal may be used to control the corresponding states of all cascaded devices.

11. The cascaded analog record/playback devices of claim 10 wherein in each device, the signal on the end of message terminal is reset responsive to the signal provided to the power down terminal, whereby a single power down signal may also be used to reset the end of message signal.

12. The cascaded analog record/playback devices of claim 11 wherein in each device, the end of message signal and the chip enable signal are negative logic signals.

13. The cascaded analog record/playback devices of claim 12 wherein in each device, the power down signal is a positive logic signal.

14. The cascaded analog record/playback devices of claim 13 wherein in each device, the playback/record signal is a playback/record positive logic signal.

15. The cascaded analog record/playback devices of claim 9 wherein each device includes a plurality of address terminals for receiving address signals for addressing the plurality of storage cells in the respective device, the address range of the address signals exceeding the storage capacity of the plurality of storage cells, with at least one address within the address range of the address signals exceeding the storage capacity of the plurality of storage cells setting an operating mode of the device for cascading with similar devices;

each of the cascaded devices having its address terminals coupled to receive address signals for setting the operating mode of the device for cascading with similar devices.

16. The cascaded analog record/playback devices of claim 15 wherein each of the cascaded devices has each of its address terminals coupled to the same respective address terminal of the other cascaded devices so that all devices receive the same address signals for setting the operating mode of the devices for cascading with similar devices.

17. Cascaded analog record/playback devices for extending the continuous recording and the playback duration beyond the duration of individual devices comprising:

a plurality of integrated circuit record/playback devices, each having;

a plurality of storage cells for storing samples of an input signal and playing back the same responsive to a chip enable signal;

an input means coupled to a signal input terminal and to the plurality of storage cells for providing samples of an input signal to the storage cells;

a multiplexer having a first input thereto coupled to the plurality of storage cells and an output thereof coupled to a first output terminal for providing stored samples of an input signal as read from the storage cells to the first output terminal when the multiplexer is set to couple the storage cells to the first output terminal;

an auxiliary input terminal coupled to the multiplexer as a second input thereto, the gain between the auxiliary input terminal and the first output terminal when the multiplexer is set to couple the auxiliary input terminal to the first output terminal being substantially unity;

means for causing the multiplexer to couple the first input thereto to the first output terminal when the samples stored in the storage cells of the device are being played back and to switch the multiplexer to couple the auxiliary input terminal to the first output terminal after the sample stored in the last storage cell of the device has been played back;

an enable terminal for receiving the chip enable signal for causing the sequential recording or playback of samples of the input signal for as long as the chip enable signal is active and the number of samples stored in the device or read out of the device is less than the storage capacity thereof;

an end of message terminal for providing an end of message signal indicative when active that the last storable sample of the input signal has been taken during record or that the last stored sample has been read out during playback;

input coupling means for coupling the signal input terminal of each of the plurality of devices together;

each of the plurality of devices after the first having its first output terminal coupled to the auxiliary input terminal of the preceding device;

means coupling the input coupling means to a signal source; and, analog signal utilization means coupled to the first output terminal of the first device;

the end of message terminal of each device other than the last of the cascaded devices being coupled to the enable terminal of the next device, whereby on recording or playback, the first of the cascaded devices, when enabled by the chip enable signal on its enable terminal, will take and record samples of an input signal or play back the same, the end of message signal of each device enabling the next successive cascaded device so that recording or playback of samples is uninterrupted as the same progresses from device to device.

18. The improvement of claim 17 wherein the signal source is a microphone.

19. The improvement of claim 18 wherein the signal utilization means is an audio speaker.

20. The improvement of claim 19 wherein each of the plurality of integrated circuit record/playback devices further has;

a second output terminal; and means coupled to the first and second output terminals for providing signals of equal amplitude and opposite phase thereon;

and wherein the speaker means is coupled directly between the first and second output terminals of the first device.

21. The improvement of claim 17 wherein:

each of the plurality of integrated circuit record/playback devices further has an automatic gain control circuit therein, the input of the automatic gain control circuit being coupled to an automatic gain control circuit input terminal and the output of the automatic gain control circuit being coupled to an automatic gain control circuit output terminal;

and wherein the automatic gain control circuit input terminal of one of the devices is coupled to a signal source and the automatic gain control circuit output terminal of the same device is coupled to the input coupling means.

22. The cascaded analog record/playback devices of claim 17 wherein each device further has a power down terminal for reducing the power consumption of the device when not active and a playback/record terminal for setting the device for playback or read depending on the state of the signal on the playback/record terminal, and wherein the power down terminals of all devices are connected together and the playback/record terminals of all devices are connected together, whereby a single power down signal and a single playback/record signal may be used to control the corresponding states of all cascaded devices.

23. The cascaded analog record/playback devices of claim 22 wherein in each device, the signal on the end of message terminal is reset responsive to the signal provided to the power down terminal, whereby a single power down signal may also be used to reset the end of message signal.

24. The cascaded analog record/playback devices of claim 23 wherein in each device, the end of message signal and the chip enable signal are negative logic signals.

25. The cascaded analog record/playback devices of claim 24 wherein in each device, the power down signal is a positive logic signal.

26. The cascaded analog record/playback devices of claim 25 wherein in each device, the playback/record signal is a playback/record positive logic signal.

27. The cascaded analog record/playback devices of claim 17 wherein each device includes a plurality of address terminals for receiving address signals for addressing the plurality of storage cells in the respective device, the address range of the address signals exceeding the storage capacity of the plurality of storage cells, with at least one address within the address range of the address signals exceeding the storage capacity of the plurality of storage cells setting an operating mode of the device for cascading with similar devices;

each of the cascaded devices having its address terminals coupled to receive address signals for setting the operating mode of the device for cascading with similar devices.

28. The cascaded analog record/playback devices of claim 27 wherein each of the cascaded devices has each of its address terminals coupled to the same respective address terminal of the other cascaded devices so that all devices receive the same address signals for setting the operating mode of the devices for cascading with similar devices.

* * * * *